US009865422B2

(12) United States Patent
Horsky et al.

(10) Patent No.: US 9,865,422 B2
(45) Date of Patent: Jan. 9, 2018

(54) PLASMA GENERATOR WITH AT LEAST ONE NON-METALLIC COMPONENT

(71) Applicant: Nissin Ion Equipment Co., Ltd., Minami-Ku, Kyoto (JP)

(72) Inventors: Thomas N. Horsky, Boxborough, MA (US); Sami K. Hahto, Nashua, NH (US)

(73) Assignee: Nissin Ion Equipment Co., Ltd., Minami-Ku, Kyoto (JP)

(*) Notice: Subject to any disclaimer, the term of this patent is extended or adjusted under 35 U.S.C. 154(b) by 177 days.

(21) Appl. No.: 14/961,021

(22) Filed: Dec. 7, 2015

(65) Prior Publication Data

US 2016/0086759 A1 Mar. 24, 2016

Related U.S. Application Data

(63) Continuation-in-part of application No. 13/835,475, filed on Mar. 15, 2013, now Pat. No. 9,275,819.
(Continued)

(51) Int. Cl.
*H01J 27/02* (2006.01)
*H01J 27/20* (2006.01)
(Continued)

(52) U.S. Cl.
CPC ............ *H01J 27/205* (2013.01); *C23C 14/48* (2013.01); *H01J 27/022* (2013.01); *H01J 37/00* (2013.01)

(58) Field of Classification Search
None
See application file for complete search history.

(56) References Cited

U.S. PATENT DOCUMENTS 5,311,028 A    5/1994  Glavish
5,497,006 A *  3/1996  Sferlazzo ............... H01J 27/14
                                                 250/423 R
(Continued)

FOREIGN PATENT DOCUMENTS

EP     1 180 783 A2    2/2002
JP     2007-220522     8/2007
(Continued)

OTHER PUBLICATIONS

T Ikejiri et al Beam Uniformity Controllable ionsource with a Long slit 1066 p. 320-323 2008 AIP publications.*
(Continued)

*Primary Examiner* — Douglas W Owens
*Assistant Examiner* — Srinivas Sathiraju
(74) *Attorney, Agent, or Firm* — Proskauer Rose LLP

(57) ABSTRACT

A plasma generator for an ion implanter is provided. The plasma generator includes an ionization chamber for forming a plasma that is adapted to generate a plurality of ions and a plurality of electrons. An interior surface of the ionization chamber is exposed to the plasma and constructed from a first non-metallic material. The plasma generator also includes a thermionic emitter including at least one surface exposed to the plasma. The thermionic emitter is constructed from a second non-metallic material. The plasma generator further includes an exit aperture for extracting at least one of the plurality of ions or the plurality of electrons from the ionization chamber to form at least one of an ion beam or an electron flux. The ion beam or the electron flux comprises substantially no metal. The first and second non-metallic materials can be the same or different from each other.

9 Claims, 18 Drawing Sheets

Related U.S. Application Data

(60) Provisional application No. 62/090,017, filed on Dec. 10, 2014, provisional application No. 62/189,917, filed on Jul. 8, 2015.

(51) Int. Cl.
*C23C 14/48* (2006.01)
*H01J 37/00* (2006.01)

(56) References Cited

U.S. PATENT DOCUMENTS

| | | | |
|---|---|---|---|
| 5,629,528 A | 5/1997 | Jost et al. | |
| 5,703,372 A * | 12/1997 | Horsky | H01J 27/08 250/423 R |
| 5,834,786 A * | 11/1998 | White | H01J 37/304 250/398 |
| 5,857,889 A * | 1/1999 | Abbott | H01J 27/022 445/49 |
| 5,906,573 A * | 5/1999 | Aretz | A61N 5/1027 600/3 |
| 6,184,624 B1 | 2/2001 | Inouchi | |
| 6,259,210 B1 * | 7/2001 | Wells | H01J 27/022 250/423 R |
| 6,566,257 B2 | 5/2003 | Sueyoshi | |
| 6,583,544 B1 | 6/2003 | Horsky et al. | |
| 6,664,547 B2 * | 12/2003 | Benveniste | H01J 37/08 250/423 R |
| 6,686,595 B2 * | 2/2004 | Horsky | H01J 27/20 250/423 R |
| 6,744,214 B2 | 6/2004 | Horsky | |
| 6,777,686 B2 | 8/2004 | Olson et al. | |
| 7,064,491 B2 | 6/2006 | Horsky et al. | |
| 7,185,602 B2 | 3/2007 | Horsky et al. | |
| 7,491,947 B2 | 2/2009 | Cobb et al. | |
| 7,622,713 B2 | 11/2009 | Quarmby et al. | |
| 7,718,041 B2 | 5/2010 | Menger et al. | |
| 7,759,657 B2 | 7/2010 | Tieger et al. | |
| 7,791,041 B2 | 9/2010 | Yamashita et al. | |
| 7,838,850 B2 | 11/2010 | Hahto et al. | |
| 7,989,784 B2 | 8/2011 | Glavish et al. | |
| 8,071,958 B2 | 12/2011 | Horsky | |
| 8,072,149 B2 | 12/2011 | Cho et al. | |
| 8,110,820 B2 | 2/2012 | Glavish | |
| 8,193,513 B2 | 6/2012 | DiVergilio et al. | |
| 8,357,912 B2 | 1/2013 | Radovanov et al. | |
| 8,436,326 B2 | 5/2013 | Glavish | |
| 8,994,272 B2 * | 3/2015 | Horsky | H01J 27/205 250/423 R |
| 2004/0031935 A1 * | 2/2004 | Nishigami | H01J 3/02 250/492.21 |
| 2004/0104683 A1 | 6/2004 | Leung et al. | |
| 2006/0019039 A1 | 1/2006 | Hanawa et al. | |
| 2006/0284104 A1 | 12/2006 | Fujita et al. | |
| 2007/0089833 A1 | 4/2007 | Inouchi et al. | |
| 2008/0277593 A1 | 11/2008 | Fujita et al. | |
| 2008/0290266 A1 | 11/2008 | Horsky et al. | |
| 2009/0001290 A1 * | 1/2009 | Yamashita | H01J 27/14 250/492.3 |
| 2009/0014667 A1 | 1/2009 | Hahto et al. | |
| 2009/0078883 A1 * | 3/2009 | Perel | H01J 37/244 250/396 R |
| 2009/0166555 A1 * | 7/2009 | Olson | H01J 27/026 250/427 |
| 2009/0206270 A1 | 8/2009 | Glayish et al. | |
| 2010/0025573 A1 | 2/2010 | Hahto et al. | |
| 2010/0066252 A1 | 3/2010 | Reijonen et al. | |
| 2010/0107980 A1 | 5/2010 | Horsky et al. | |
| 2010/0197125 A1 * | 8/2010 | Low | H01J 37/09 438/514 |
| 2010/0320395 A1 | 12/2010 | Hahto | |
| 2011/0084219 A1 | 4/2011 | Adamec et al. | |
| 2011/0089321 A1 | 4/2011 | Glavish | |
| 2011/0139613 A1 | 6/2011 | Ikejiri et al. | |
| 2012/0085917 A1 * | 4/2012 | Kurunczi | H01J 37/026 250/396 ML |
| 2012/0200980 A1 * | 8/2012 | Blake | H01L 21/6831 361/212 |
| 2012/0255490 A1 | 10/2012 | Tanjo | |
| 2012/0255491 A1 * | 10/2012 | Hadidi | H01J 37/32935 118/712 |
| 2014/0265856 A1 * | 9/2014 | Hahto | H01J 27/205 315/111.41 |
| 2016/0086759 A1 * | 3/2016 | Horsky | H01J 27/205 315/111.21 |

FOREIGN PATENT DOCUMENTS

| | | |
|---|---|---|
| JP | 2008-034230 | 2/2008 |
| JP | 2008-047491 | 2/2008 |
| JP | 2008-084679 | 4/2008 |
| JP | 2008-097975 | 4/2008 |
| KR | 2008 0102830 | 11/2008 |
| WO | 02/25685 A1 | 3/2002 |

OTHER PUBLICATIONS

Ikejiri, et al., "Beam Uniformity Controllable Ion Source with a Long Slit," Ion Implantation Technology, 2008, 4 pages.

Ito, H., et al. "Plasma Flood System—Physics of Low Energy Electron Generation, Plasma Coupling, Electron Transport and Surface Charge Neutralization on Wafer", Proceedings of the 11th International Conference on Ion Implantation Technology, Austin, TX, USA, Jun. 16-21, 1996, pp. 432-435.

Liebert, R.B., et al. "Tungsten Contamination in BF2 Implants", Proceedings of the 11th International Conference on Ion Implantation Technology, Austin, TX, USA, Jun. 16-21, 1996, pp. 135-138.

Ito, H., et al., "High Density Plasma Flood System for Wafer Charge Neutralisation," 1998 international conference on ion implantation technology pp. 478-481.

Niwayama, M., et al., "A Study of Charge Neutralization Method during High Current Ion Implantation for Ultra Thin Gate Dielectrics,"1998 international conference on ion implantation technology proceedings pp. 598-601.

* cited by examiner

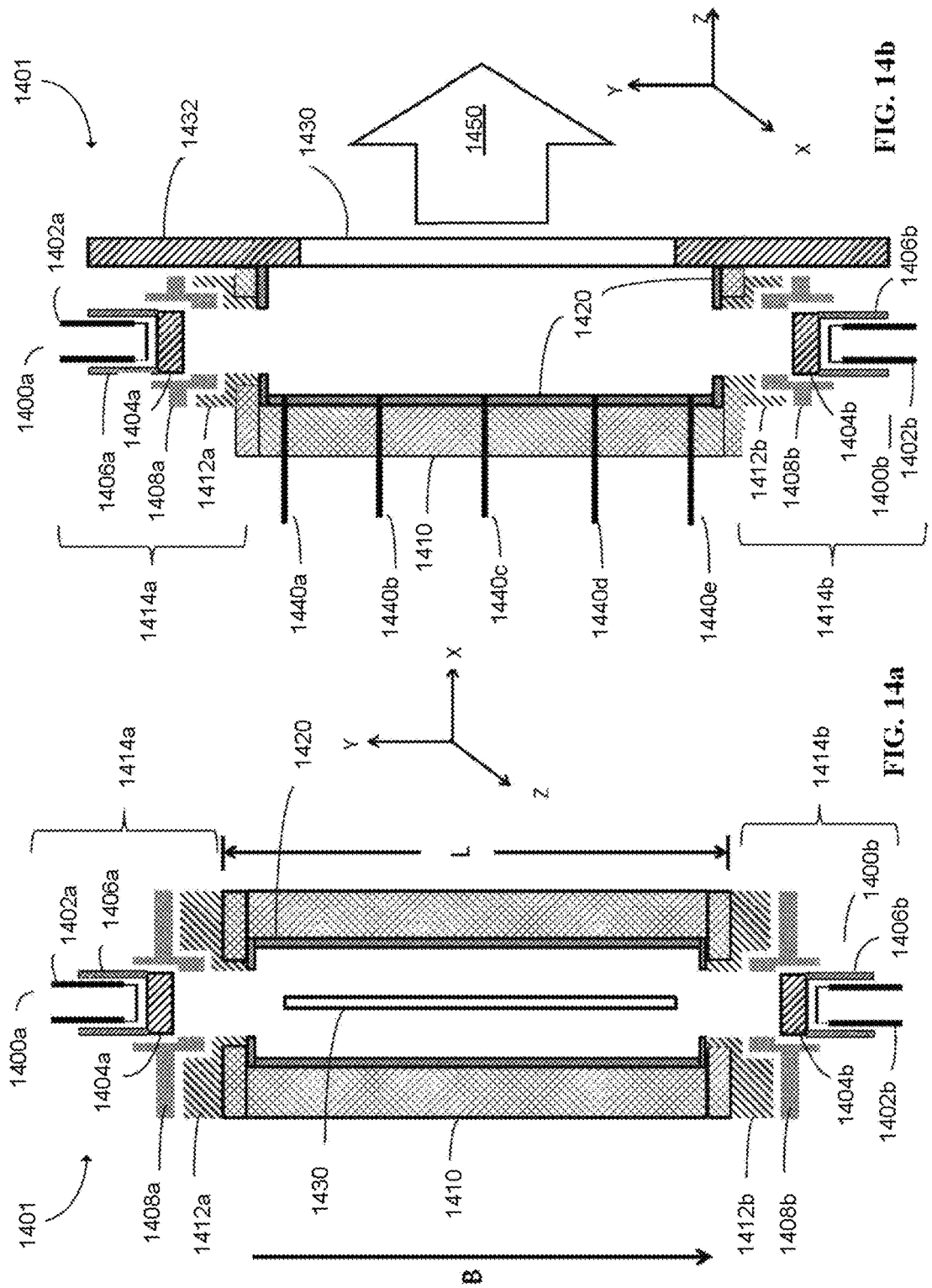

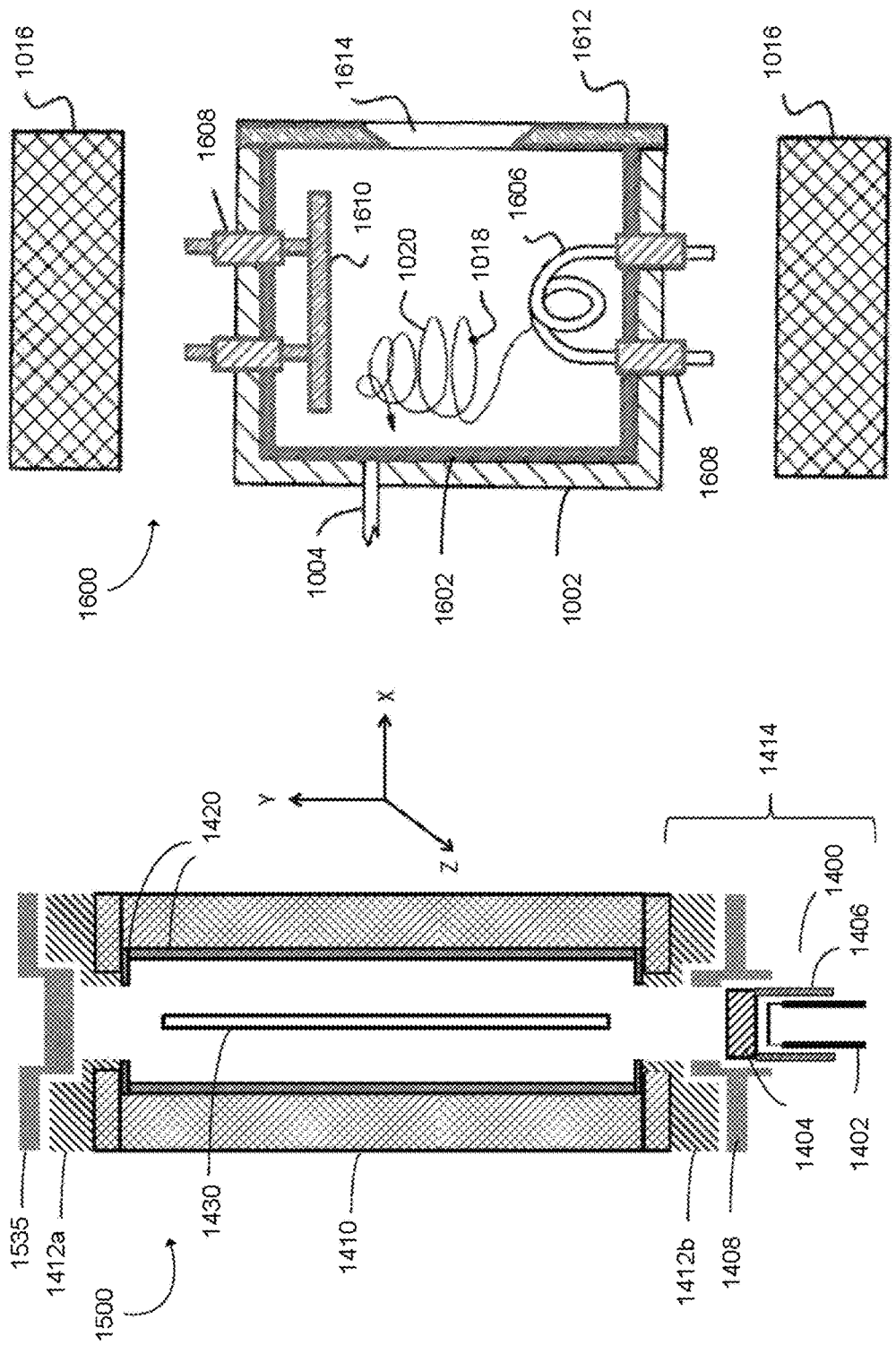

PLASMA GENERATOR WITH AT LEAST ONE NON-METALLIC COMPONENT

CROSS REFERENCE TO RELATED APPLICATIONS

This application is a continuation-in-part of U.S. Ser. No. 13/835,475, filed Mar. 15, 2013. This application also claims the benefit of and priority to U.S. Provisional Patent Application Ser. Nos. 62/090,017 and 62/189,917, filed Dec. 10, 2014 and Jul. 8, 2015, respectively. The contents of these applications are owned by the assignee of the instant application and are incorporated herein by reference in their entirety.

FIELD OF THE INVENTION

The invention relates generally to plasma generators for ion implanters, and more particularly, to plasma generators with one or more components constructed from non-metallic material(s).

BACKGROUND OF THE INVENTION

Ion implantation has been a critical technology in semiconductor device manufacturing and is currently used for many processes including fabrication of the p-n junctions in transistors, particularly for CMOS devices such as memory and logic chips. By creating positively-charged ions containing the dopant elements required for fabricating the transistors in silicon substrates, the ion implanters can selectively control both the energy (hence implantation depth) and ion current (hence dose) introduced into the transistor structures. Traditionally, ion implanters have used ion sources that generate a ribbon beam of up to about 50 mm in length. The beam is transported to the substrate and the required dose and dose uniformity are accomplished by electromagnetic scanning of the ribbon across the substrate, mechanical scanning of the substrate across the beam, or both. In some cases, an initial ribbon beam can be expanded to an elongated ribbon beam by dispersing it along a longitudinal axis. In some cases, a beam can even assume an elliptical or round profile.

Currently, there is an interest in the industry in extending the design of conventional ion implanters to produce a ribbon beam of larger extent. This industry interest in extended ribbon beam implantation is generated by the recent industry-wide move to larger substrates, such as 450 mm-diameter silicon wafers. During implantation, a substrate can be scanned across an extended ribbon beam while the beam remains stationary. An extended ribbon beam enables higher dose rates because the resulting higher ion current can be transported through the implanter beam line due to reduced space charge blowup of the extended ribbon beam. To achieve uniformity in the dose implanted across the substrate, the ion density in the ribbon beam needs to be fairly uniform relative to a longitudinal axis extending along its long dimension. However, such uniformity is difficult to achieve in practice.

In some beam implanters, corrector optics has been incorporated into the beam line to alter the ion density profile of the ion beam during beam transport. For example, Bernas-type ion sources have been used to produce an ion beam of between 50 mm to 100 mm long, which is then expanded to the desired ribbon dimension and collimated by ion optics to produce a beam longer than the substrate to be implanted. Using corrector optics is generally not sufficient to create good beam uniformity if the beam is greatly non-uniform upon extraction from the ion source or if aberrations are induced by space-charge loading and/or beam transport optics.

In some beam implanter designs, a large-volume ion source is used that includes multiple cathodes aligned along the longitudinal axis of the arc slit, such that emission from each cathode can be adjusted to modify the ion density profile within the ion source. Multiple gas introduction lines are distributed along the long axis of the source to promote better uniformity of the ion density profile. These features attempt to produce a uniform profile during beam extraction while limiting the use of beam profile-correcting optics. Notwithstanding these efforts, the problem of establishing a uniform ion density profile in the extracted ion beam remains one of great concern to manufacturers of ribbon beam ion implanters, especially when utilizing ion sources having extraction apertures dimensioned in excess of 100 mm. Therefore, there is a need for an improved ion source design capable of producing a relatively uniform extracted ion beam profile.

Another shortcoming of traditional ion implanters is that they have ion sources made mostly of refractory metals. However, such metallic ions sources can produce ion beams containing contaminants (e.g., refractory metal compounds) that are difficult to remove even with the aid of sophisticated mass selection approaches. Hence, at least some contaminants are transported and implanted onto a workpiece. If the workpiece is a silicon wafer used in the fabrication of integrated circuits, the presence of even a few parts-per-million (ppm) of the contaminants can negatively affect yield.

Since ion beams are composed of positively-charged ions, positive charge can build up on an implanted workpiece, potentially damaging the devices which populate the workpiece. To implement charging control, an electron flood is typically deployed near the workpiece. Such electron floods are devices which emit copious amounts of low-energy electrons. The low-energy electrons can propagate directly to the workpiece, and can also be trapped by the positive potential of the ion beam and carried to the workpiece by the ion beam. Modern implanters typically use "plasma electron floods," which are similar in construction to ion sources. However, unlike an ion source, a plasma electron flood's purpose is to produce low-energy electrons in sufficient quantities to compensate for positive charging of the workpiece during implantation. A common type of plasma electron flood incorporates a thermionic filament, which historically is composed of a refractory metal such as tungsten. In a typical plasma electron flood, due to its proximity to the substrate, tungsten evaporated from the hot filament can contaminate the substrate during flood operation. If the workpiece is a silicon wafer used in the fabrication of integrated circuits, the presence of even a few parts-per-million (ppm) of refractory metal contaminants can negatively affect yield.

In recent years, plasma electron floods have been introduced that do not contain a thermionic filament, but rather use microwave excitation or radio-frequency (RF) excitation to produce the plasma. While such floods may not produce refractory metal contamination, they are expensive, relatively large, and complex to design and operate.

SUMMARY OF THE INVENTION

Therefore, there is a need for an improved ion source of an ion implanter that is capable of producing little or no contaminants (e.g., refractory metal compounds) so as to reduce metals contamination levels introduced into a workpiece. Additionally, there is a need for an improved thermionic filament-based plasma electron flood for an ion implanter that is capable of producing little or no contaminants introduced into a workpiece. The present invention provides plasma generators (e.g., ion sources and/or plasma electron floods) for ion implanters that meet such needs, i.e., capable of producing little or no contaminants in the extracted ion beam or electron flux.

In one aspect, an ion source is provided that has substantially no metallic materials exposed to the source plasma in the ion source. This can be achieved by selecting certain materials to fabricate one or more ion source components having surfaces that are in direct contact with the source plasma. Such a design is applicable to ion sources presently being used in the field and enables a significant improvement in ion-implanted device yields.

In some embodiments of the ion source, these materials are selected from a group of materials of the form $X_mY_n$ or C, where m and n are integers (including zero), X and Y are nonmetallic elements, and C is carbon in various forms, including diamond. Exemplary materials in this category include silicon carbide (SiC), silicon nitride ($Si_3N_4$), graphite, graphene, and vitreous carbon.

In some embodiments of the ion source, these materials include the chemical elements aluminum (Al) and/or boron (B). Since these materials are electrical dopants in silicon, they are not as detrimental to device yields as transition metals, refractory metals, or noble metals. In some embodiments, these materials, which can be used to fabricate ion source components whose surfaces are in direct contact with source plasma, are selected from a group of materials of the form $X_mY_n$, C, or B, where m and n are integers (including zero), X and Y are either nonmetallic elements such as Si, N, or C, or are additionally selected from the elements Al, and B, and C is carbon in various forms, including diamond. Exemplary materials in this category include $Al_2O_3$, AlN, B, BN, and $B_4C$.

In general, boron (B), graphite, and graphene are sometimes referred to as semi-metals and sometimes referred to as non-metals. Hereinafter, these materials are categorized as non-metals. Therefore, in the present invention, non-metallic materials that are usable to construct one or more components of a plasma generator can include certain "semi-metals", such as B, graphite, and/or graphene.

In still further embodiments of the ion source, all ion source components whose surfaces are in direct contact with source plasma are fabricated from a group of materials of the form $X_mY_n$, C, or B, where m and n are integers (including zero), X and Y are either nonmetallic elements such as Si, N, or C, or are additionally selected from the elements Al and B, and C is carbon in various forms, including diamond, except for the thermionic emitter, which is made from a refractory metal.

In another aspect, a plasma electron flood having a thermionic filament is provided that has substantially no metallic materials exposed to the plasma in the flood. This can be achieved by selecting certain materials to fabricate one or more flood components having surfaces that are in direct contact with the flood plasma. Such a design is applicable to plasma electron floods presently being used in the field and enables a significant improvement in ion-implanted device yields.

In some embodiments of the plasma electron flood, these materials are selected from a group of materials of the form $X_mY_n$ or C, where m and n are integers (including zero), X and Y are nonmetallic elements, and C is carbon in various forms, including diamond. Exemplary materials in this category include silicon carbide (SiC), silicon nitride ($Si_3N_4$), graphite, graphene, diamond, and vitreous carbon.

In yet another aspect, a plasma generator of the present invention includes an ionization chamber for forming a plasma that is adapted to generate a plurality of ions and a plurality of electrons. An interior surface of the ionization chamber is exposed to the plasma and constructed from a first non-metallic material. The plasma generator also includes a thermionic emitter including at least one surface exposed to the plasma. The thermionic emitter is constructed from a second non-metallic material. The plasma generator further includes an exit aperture for extracting at least one of the plurality of ions or the plurality of electrons from the ionization chamber to form at least one of an ion beam or an electron flux. The ion beam or the electron flux comprises substantially no metal. The first and second non-metallic materials can be the same or different from each other.

In some embodiments, the thermionic emitter comprises one of an indirectly-heated cathode (IHC) or a filament. The IHC or filament can be formed of silicon carbide. The IHC or filament is formed of carbon.

In some embodiments, the interior surface of the ionization chamber comprises a liner of the ionization chamber.

In some embodiments, the plasma generator further comprises at least one of a repeller electrode or a source extraction aperture plate constructed from a third non-metallic material. The third non-metallic material can be the same as at least one of the first or second metallic material. Alternatively, the third non-metallic material can be different from the first and/or second non-metallic materials. In some embodiments, the plasma generator comprises a plurality of components with at least one surface of each component exposed to the plasma. The plurality of components can be constructed from one or more non-metallic materials.

In some embodiments, the first or second non-metallic material is selected from a group of materials in the form of $X_mY_n$ or C, wherein m and n are integers, X and Y are nonmetallic elements, and C represents carbon. In some embodiments, the first or second non-metallic material comprises one of silicon carbide (SiC), silicon nitride ($Si_3N_4$), graphite, diamond, graphene, or vitreous carbon. In some embodiments, the first or second non-metallic material includes at least one of the elements Al or B. For example, the first or second non-metallic material can comprise at least one of $Al_2O_3$, AlN, B, BN, or $B_4C$.

In yet another aspect, the present invention features a plasma generator for an ion implanter. The plasma generator includes an ionization chamber for forming a plasma that is adapted to generate a plurality of ions and a plurality of electron and a thermionic emitter including at least one surface exposed to the plasma. The thermionic emitter is located outside of the ionization chamber. The plasma generator also includes an exit aperture for extracting at least one of the plurality of ions or the plurality of electrons from the ionization chamber to form at least one of an ion beam or an electron flux. The ion beam or the electron flux comprises a low concentration of metal ions or neutrals. All surfaces of the plasma generator being exposed to the plasma, including an interior surface of the ionization chamber, are constructed from one or more non-metallic materials, except for the thermionic emitter that is constructed from a refractory metal.

In some embodiments, the one or more non-metallic materials comprise at least one of silicon carbide (SiC), silicon nitride ($Si_3N_4$), graphite, diamond, graphene, or vitreous carbon.

In yet another aspect, the present invention features a plasma generator for an ion implanter. The plasma generator includes at least one electron gun and an ionization chamber. The at least one electron gun includes an electron source for generating a beam of electrons and a plasma region for generating a secondary plasma by electron impact. The secondary plasma is sustained by at least a portion of the beam of electrons. The ionization chamber includes two ends disposed along a longitudinal axis. One of the two ends comprises an aperture coupled to an outlet of the electron gun and configured to receive from the electron gun at least a portion of the beam of electrons. The ionization chamber is adapted to generate a primary plasma based on the at least a portion of the beam of electrons received from the electron gun. The ionization chamber also includes n interior surface that is exposed to the primary plasma and constructed from a non-metallic material.

In some embodiments, the plasma generator further includes an exit aperture for extracting at least one of the plurality of ions or the plurality of electrons from the ionization chamber to form at least one of an ion beam or an electron flux. The ion beam or the electron flux comprises substantially no metal.

In some embodiments, the electron gun includes a thermionic emitter including at least one surface exposed to the primary plasma or the secondary plasma. The thermionic emitter can be constructed from a second non-metallic material same as or different from the non-metallic material. The thermionic emitter can be constructed from a refractory metal.

In some embodiments, the non-metallic material comprises one of silicon carbide (SiC), silicon nitride ($Si_3N_4$), graphite, diamond, graphene, or vitreous carbon.

In some embodiments, the primary plasma is adapted to generate a plurality of ions and a plurality of electrons. In some embodiments, the secondary plasma in the electron gun is adapted to generate a second plurality of ions supplied from the outlet of the electron gun to the ionization chamber via the aperture. In some embodiments, the plasma region is defined by at least an anode and a ground element. A voltage of the anode is adjustable by a control circuit to turn off the secondary plasma in the electron gun.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The advantages of the technology described above, together with further advantages, may be better understood by referring to the following description taken in conjunction with the accompanying drawings. The drawings are not necessarily to scale, emphasis instead generally being placed upon illustrating the principles of the technology.

FIGS. 14a and b show cross-sectional views of an exemplary ion source in the X-Y plane and Y-Z plane, respectively.

FIG. 15 shows another exemplary ion source.

FIG. 16 shows an exemplary Bernas ion source modified from the ion source of FIG. 10.

DESCRIPTION OF THE INVENTION

Figure 1:
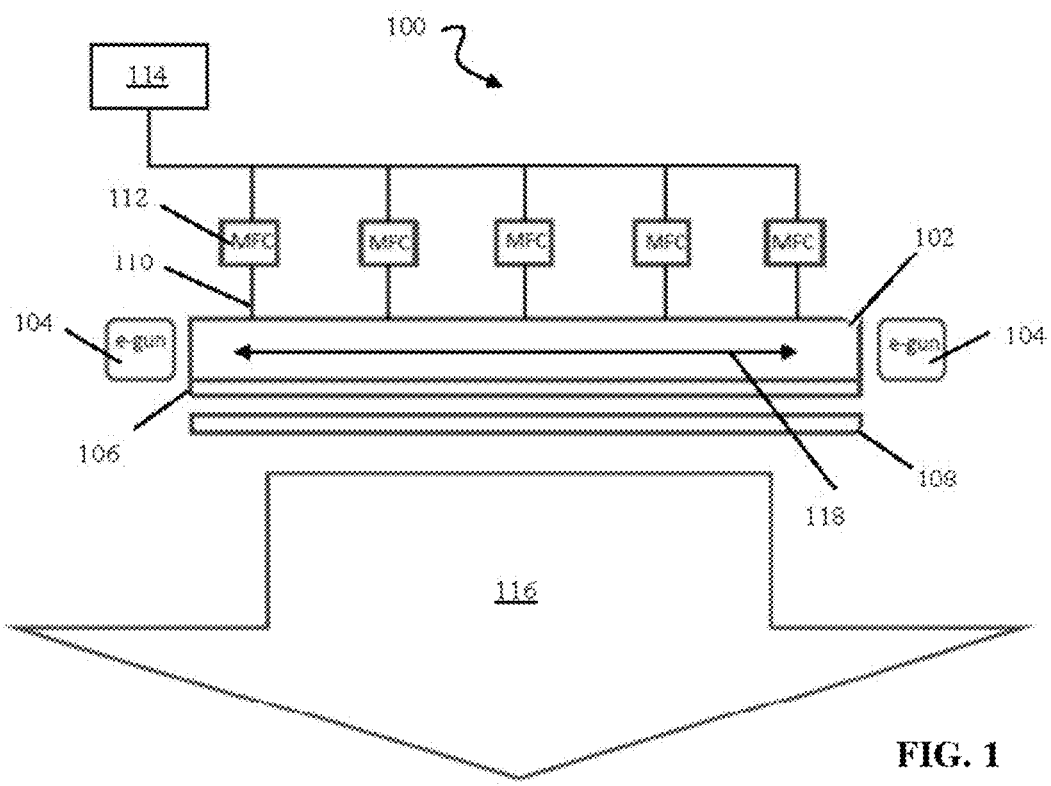
FIG. 1 shows a schematic diagram of an exemplary ion source.

FIG. 1 shows a schematic diagram of an exemplary ion source, according to embodiments of the present invention.

The ion source 100 can be configured to produce an ion beam for transport to an ion implantation chamber that implants the ion beam into, for example, a semiconductor wafer. As shown, the ion source 100 includes an ionization chamber 102 defining a longitudinal axis 118 along the long dimension of the ionization chamber 102, a pair of electron guns 104, a plasma electrode 106, a puller electrode 108, a gas delivery system comprising a plurality of gas inlets 110 and a plurality of mass flow controllers (MFCs) 112, a gas source 114, and a resultant ion beam 116. In operation, gaseous material from the gas source 114 is introduced into the ionization chamber 102 via the gas inlets 110. The gas flow through each of the gas inlets 110 can be controlled by the respective mass flow controllers 112 coupled to the inlets 110. In the ionization chamber 102, a primary plasma forms from the gas molecules that are ionized by electron impact from the electron beam generated by each of the pair of electron guns 104 positioned on opposing sides of the ionization chamber 102. In some embodiments, the electron guns 104 can also introduce additional ions into the ionization chamber 102. The ions in the ionization chamber 102 can be extracted via an extraction aperture (not shown) and form an energetic ion beam 116 using an extraction system comprising the plasma electrode 106 and the puller electrode 108. The longitudinal axis 118 can be substantially perpendicular to the direction of propagation of the ion beam 116. In some embodiments, one or more magnetic field sources (not shown) can be positioned adjacent to the ionization chamber 102 and/or the electron guns 104 to produce an external magnetic field that confines the electron beam generated by the electron guns 104 inside of the electron guns 104 and the ionization chamber 102.

The gas source 114 can introduce one or more input gases into the ionization chamber 102, such as $AsH_3$, $PH_3$, $BF_3$, $SiF_4$, Xe, Ar, $N_2$, $GeF_4$, $CO_2$, CO, $CH_3$, $SbF_5$, and/or $CH_6$, for example. The input gas can enter the ionization chamber 102 via a gas delivery system including i) multiples gas inlets 110 spaced on a side wall of the ionization chamber 102 along the longitudinal axis 118, and ii) multiple mass flow controllers 112 each coupled to one of the gas inlets 110. Because the ion density of the primary plasma in the ionization chamber 102 depends on the density of the input gas, adjusting each mass flow controller 112 separately can provide improved control of ion density distribution in the longitudinal direction 118. For example, a control circuit (not shown) can monitor the ion density distribution of the extracted beam 116 and automatically adjust the flow rate of the input gas via one or more of the mass flow controllers 112 so as to achieve a more uniform density profile in the extracted beam 116 along the longitudinal direction. In some embodiments, the gas source 114 can include a vaporizer for vaporizing a solid feed material, such as $B_{10}H_{14}$, $B_{18}H_{22}$, $C_{14}H_{14}$, and/or $C_{16}H_{10}$, to generate a vapor input for supply into the ionization chamber 102. In this case, one or more separate vapor inlets (not shown) can be used to introduce the vapor input into the ionization chamber 102, bypassing the MFC-coupled inlets 110. The one or more separate vapor inlets can be dispersed evenly along a side wall of the ionization chamber 102 in the direction of the longitudinal axis 118. In some embodiments, the gas source 114 comprises one or more liquid phase gas sources. A liquid phase material can be gasified and introduced into the ionization chamber 102 using the gas delivery system comprising the gas inlets 110 and the mass flow controllers 112. The mass flow controllers 112 can be appropriated adjusted to facilitate the flow of the gas evolved from the liquid phase material.

In general, the ionization chamber 102 can have a rectangular shape that is longer in the longitudinal direction 118 than in the transverse direction (not shown). The ionization chamber 102 can also have other shapes, such as a cylindrical shape, for example. The length of the ionization chamber 102 along the longitudinal direction 118 may be about 450 mm. The extraction aperture (not shown) can be located on an elongated side of the ionization chamber 102 while each of the electron guns 102 is located at a transverse side. The extraction aperture can extend along the length of the ionization chamber 102, such as about 450 mm long.

To extract ions from the ionization chamber 102 and to determine the energy of the implanted ions, the ion source 100 is held at a high positive source voltage by a source power supply (not shown), between 1 kV and 80 kV, for example. The plasma electrode 106 can comprise an extraction aperture plate on a side of the ionization chamber 102 along the longitudinal axis 118. In some embodiments, the plasma electrode 106 is electrically isolated from the ionization chamber 102 so that a bias voltage can be applied to the plasma electrode 106. The bias voltage is adapted to affect characteristics of the plasma generated within the ionization chamber 102, such as plasma potential, residence time of the ions, and/or the relative diffusion properties of the ion species within the plasma. The length of the plasma electrode 106 can be substantially the same as the length of the ionization chamber 102. For example, the plasma electrode 106 can comprise a plate containing a 450 mm by 6 mm aperture shaped to allow ion extraction from the ionization chamber 102.

One or more additional electrodes, such as the puller electrode 108, are used to increase extraction efficiency and improve focusing of the ion beam 116. The puller electrode 108 can be similarly configured as the plasma electrode 106. These electrodes can be spaced from each other by an insulating material (e.g., 5 mm apart) and the electrodes can be held at different potentials. For example, the puller electrode 108 can be biased relative to the plasma electrode 106 or the source voltage by up to about −5 kV. However, the electrodes can be operated over a broad range of voltages to optimize performance in producing a desired ion beam for a particular implantation process.

Figure 2:
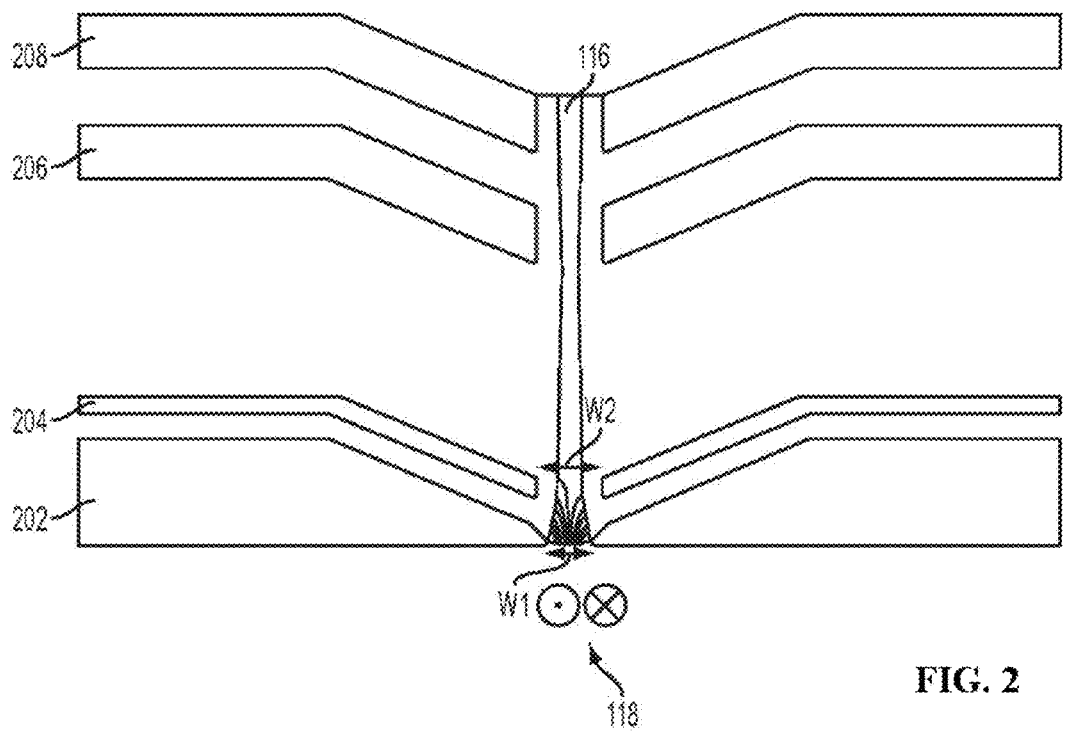
FIG. 2 shows a schematic diagram of an exemplary ion beam extraction system.

FIG. 2 shows a schematic diagram of an exemplary ion beam extraction system, according to embodiments of the present invention. As illustrated, the extraction system includes a plasma electrode 202 located closest to the ionization chamber 102, followed by a puller electrode 204, a suppression electrode 206 and a ground electrode 208. The electrode apertures are substantially parallel to the longitudinal axis 118 of the ionization chamber 102. The plasma electrode 202 and the puller electrode 204 are similar to the plasma electrode 106 and the puller electrode 108 of FIG. 1, respectively. In some embodiments, the plasma electrode 202 is shaped according to the Pierce angle to counteract the space charge expansion of the ion beam 116, thus enabling substantially parallel beam trajectories upon extraction. In some embodiments, the aperture of the plasma electrode 202 includes, on a side closest to the plasma in the ionization chamber 102, an undercut, which helps to define a plasma boundary by introducing a sharp edge (hereinafter referred to as a "knife edge.") The width of the plasma electrode aperture can be substantially the same as the width of the knife edge along the dispersive plane. This width is indicated as W1 in FIG. 2. The value of W1 can range from about 3 mm to about 12 mm. In addition, as shown in FIG. 2, the width of the aperture of the puller electrode 204 in the dispersive plane (W2) can be wider than that of the plasma electrode 202, such as about 1.5 times wider. The ground electrode 208 can be held at terminal potential, which is at earth ground unless it is desirable to float the terminal below ground, as is the case for certain implantation systems. The suppression electrode 206 is biased negatively with respect to the ground electrode 208, such as at about −3.5 kV, to reject or suppress unwanted electrons that otherwise would be attracted to the positively-biased ion source 100 when generating a positively-charged ion beam 116. In general, the extraction system is not limited to two electrodes (e.g., the suppression electrode 206 and the ground electrode 208); more electrodes can be added as needed.

In some embodiments, a control circuit (not shown) can automatically adjust the spacing of one or more of the electrodes along the direction of propagation of the ion beam 116 (i.e., perpendicular to the longitudinal axis 118) to enhance focusing of the ion beam 116. For example, a control circuit can monitor beam quality of the ion beam 116 and, based on the monitoring, move at least one of the suppression electrode 206 or the ground electrode 208 closer to or further away from each other to change the extraction field. In some embodiments, the control circuit tilts or rotates at least one of the suppression electrode 206 or the ground electrode 208 in relation to the path of the ion beam 116 to compensate for mechanical errors due to the placement of the electrodes. In some embodiments, the control circuit moves the suppression electrode 206 and the ground electrode 208 (group 1 electrodes) together along a particular beam path, in relation to the remaining electrodes (group 2 electrodes), including the plasma electrode 202 and the puller electrode 204, which can be held stationery. The gap between the group 1 electrodes and group 2 electrodes can be determined based on a number of factors, such as ion beam shape, required energy of the ion beam and/or ion mass.

Figure 3:
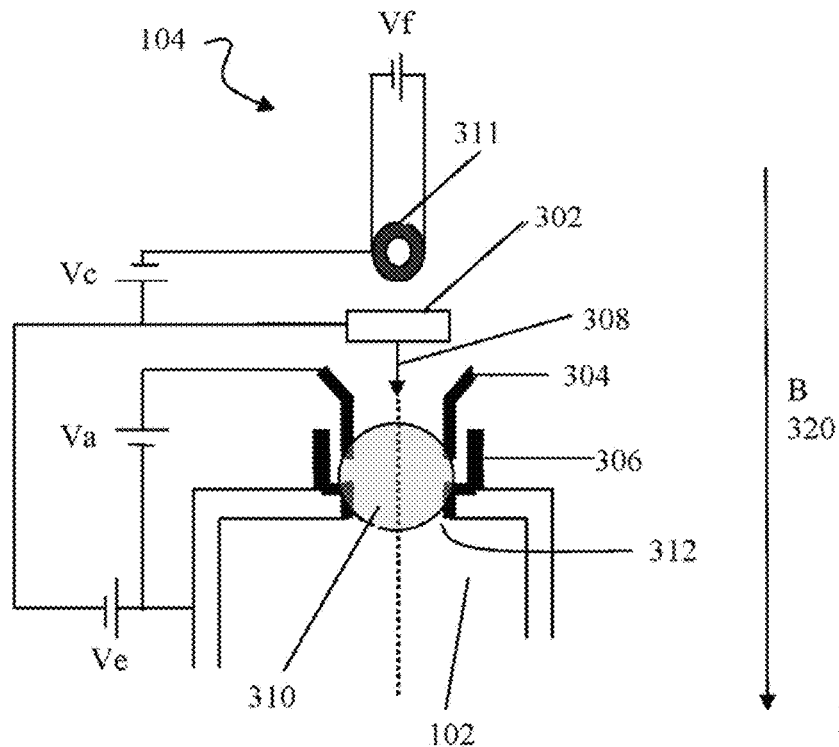
FIG. 3 shows a schematic diagram of an exemplary electron gun assembly.

FIG. 3 shows a schematic diagram of an exemplary electron gun assembly 104, according to embodiments of the present invention. As illustrated, the electron gun 104 includes a cathode 302, an anode 304, a ground element 306, and a control circuit (not shown). Thermionic electrons are emitted by the cathode 302, which may be constructed of refractory metal such as tungsten or tantalum, for example, and can be heated directly or indirectly. If the cathode 302 is heated indirectly, a filament 311 may be used to perform the indirect heating. Specifically, an electric current can flow through the filament 311 to heat the filament 311, which thermionically emits electrons as a result. By biasing the filament 311 to a voltage several hundred volts below the potential of the cathode 302, such as up to 600 V negative with respect to the cathode, the thermionically emitted electrons generated by the filament 311 can heat the cathode 302 by energetic electron bombardment. The cathode 302 is adapted to thermionically emit electrons, leading to the formation of an energetic electron beam 308 at the anode 304, which is held at a positive potential in relation to the cathode 302. The electron beam 308 is adapted to enter the ionization chamber 102 via aperture 312 of the ionization chamber, where it generates a primary plasma (not shown) by ionizing the gas within the ionization chamber 102.

In addition, the control circuit can cause a secondary plasma 310 to be formed in the electron gun 104 between the anode 304 and the ground element 306. Specifically, a potential can be created between the anode 304 and the ground element 306 such that it establishes an electric field sufficient to create the secondary plasma 310 in the presence of the electron beam 308. The secondary plasma is created by the ionization of a gas that enters the electron gun 104 from the ionization chamber 102 via the aperture 312, where the gas can be supplied by the inlets 110. The electron beam 308 can sustain the secondary plasma 310 for an extended period of time. The plasma density of the secondary plasma 310 is proportional to the arc current of the anode 304, which is an increasing function of the positive anode voltage. Therefore, the anode voltage can be used by the control circuit to control and stabilize the secondary plasma 310 in conjunction with closed-loop control of the current sourced by an anode power supply (not shown). The secondary plasma 310 is adapted to generate positively charged ions that can be propelled into the ionization chamber 102 via the aperture 312, thereby increasing the ion density of the extracted ion beam 116. The propelling movement arises when the positively charged ions, generated by the secondary plasma 310, are repelled by the positively biased anode 304 to travel toward the ionization chamber 102.

The control circuit can form the secondary plasma 310 in the electron gun 104 by applying a positive voltage to the anode 304. The control circuit can control the amount of ions generated by the secondary plasma 310 and stabilize the secondary plasma 310 in part by closed-loop control of the current sourced by the anode power supply. This current is the arc current sustained by the plasma discharge between the anode 304 and the ground element 306. Hereinafter, this mode of operation is referred as the "ion pumping mode." In the ion pumping mode, in addition to ions, the electron beam 308 also travels to the ionization chamber 102 via the aperture 312 to form the primary plasma in the ionization chamber 102. The ion pumping mode may be advantageous in situations where increased extraction current is desired. Alternatively, the control circuit can substantially turn off the secondary plasma 310 in the electron gun 104 by suitably adjusting the voltage of the anode 304, such as setting the voltage of the anode 304 to zero. In this case, only the electron beam 308 flows from the electron gun 104 to the ionization chamber 102, without being accompanied by a significant quantity of positively charged ions. Hereinafter, this mode of operation is referred to as the "electron impact mode."

In yet another mode of operation, the control circuit can form the secondary plasma 310 in the electron gun 104 without providing the electron beam 308 to the ionization chamber 102. This can be accomplished by suitably adjusting the voltage of the emitter (i.e., the cathode 302), such as grounding the cathode 302 so it is at the same potential as the ionization chamber 102. The result is that the electrons in the electron beam 308 would have low energy as they enter the ionization chamber 102, effectively allowing much weaker or no electron beam to enter the ionization chamber 102 or form useful electron bombardment ionization within the ionization chamber 102. In this mode of operation, the secondary plasma 310 can generate positive ions for propulsion into the ionization chamber 102. In this mode of operation, the electron gun 104 acts as the plasma source, not the ionization chamber 102. Hereinafter, this mode of operation is referred to as the "plasma source mode." The plasma source mode has several advantages. For example, cost and complexity is reduced by removing the emitter voltage supply, which typically is a 2 kV, 1 A supply. The plasma source mode can be initiated in a plasma flood gun, a plasma doping apparatus, plasma chemical-vapor deposition (CVD), etc. In some embodiments, radio-frequency discharge can be used to generate the plasma 310 in the plasma source mode. However, in general, the electron gun 104 can act as a plasma source and/or an ion source.

Generally, activating the secondary plasma 310 in the electron gun 104 can prolong the usable life of the ion source 100. The primary limiting factor in achieving long ion source life is failure of the cathode 302, principally due to cathode erosion caused by ion sputtering. The degree of ion sputtering of the cathode 302 depends on a number of factors, including: i) the local plasma or ion density, and ii) the kinetic energy of the ions as they reach the cathode 302. Since the cathode 302 is remote from the primary plasma in the ionization chamber 102, ions created in the ionization chamber 102 have to flow out of the ionization chamber 102 to reach the cathode 302. Such an ion flow is largely impeded by the positive potential of the anode 304. If the potential of the anode 304 is high enough, low-energy ions cannot overcome this potential barrier to reach the negatively-charged cathode 302. However, the plasma ions created in the arc between the anode 304 and the ground element 306 can have an initial kinetic energy as high as the potential of the anode 304 (e.g., hundreds of eV). Ion sputtering yield is an increasing function of the ion energy K. Specifically, the maximum value of K in the vicinity of the electron gun 104 is given by: K=e (Ve–Va), where Va is the voltage of the anode 304, Ve is the voltage of the cathode 302, and e is the electron charge. According to this relationship, K can be as large as the potential difference between the cathode 302 and the anode 304. Thus, to maximize the lifetime of the cathode 302, this difference can be minimized. In some embodiments, to keep the plasma or ion density near the cathode 302 low, the arc current of the plasma source mode is adjusted to be low as well. Such conditions correspond more closely to the electron impact mode than the plasma source mode, although both may be usefully employed without sacrificing cathode life. In general, the ion sputtering yield of refractory metals is minimal below about 100 eV and increases rapidly as ion energy increases. Therefore, in some embodiments, maintaining K below about 200V minimizes ion sputtering and is conducive to long life operation.

In some embodiments, the control circuit can operate the ion source 100 in either a "cluster" or "monomer" mode. As described above, the ion source 100 is capable of sustaining two separate regions of plasma—i) the secondary plasma 310 generated from an arc discharge between the anode 304 and the ground element 306 and ii) the primary plasma (not shown) generated from electron impact ionization of the gas within the ionization chamber 102. The ionization properties of these two plasma-forming mechanisms are different. For the secondary plasma 310, the arc discharge between the anode 304 and the ground element 306 can efficiently dissociate molecular gas species and create ions of the dissociated fragments (e.g., efficiently converting $BF_3$ gas to $B^+$, $BF^+$, $BF_2^+$ and $F^+$), in addition to negatively-charged species. In contrast, the plasma formed in the ionization chamber 102 by electron-impact ionization of the electron beam 308 tends to preserve the molecular species without substantial dissociation (e.g., converting $B_{10}H_{14}$ to $B_{10}H_x^+$ ions, where "x" denotes a range of hydride species, such as $B_{10}H_9^+$, $B_{10}H_{10}^+$, etc.). In view of these disparate ionization properties, the control circuit can operate the ion source 100 to at least partially tailor the ionization properties to a user's desired ion species. The control circuit can modify the "cracking pattern" of a particular gas species (i.e., the relative abundance of particular ions formed from the neutral gas species) to increase the abundance of the particular ion as desired for a given implantation process.

Specifically, in the monomer mode of operation, the control circuit can initiate either the ion pumping mode or the plasma source mode, where the secondary plasma is generated to produce a relative abundance of more dissociated ions. In contrast, in the cluster mode of operation, the control circuit can initiate the electron impact mode, where the primary plasma is dominant and the secondary plasma is weak to non-existent, to produce a relative abundance of more clustered ions. Thus, the monomer mode allows more positively charged ions to be propelled from the secondary plasma 310 of the electron gun 104 into the ionization chamber 102, but allows a weaker electron beam 308 or no electron beam to enter the ionization chamber 102. In contrast, the cluster mode of operation allows fewer positively charged ions, but a stronger electron beam 308 to enter the ionization chamber 102 from the electron gun 104.

As an example, consider the molecule $C_{14}H_{14}$. Ionization of this molecule produces both $C_{14}H_x^+$ and $C_7H_x^+$ ions due to symmetry in its bonding structure. Operating the ion source in the cluster mode increases the relative abundance of $C_{14}H_x^+$ ions, while operating the ion source in the monomer mode increases the relative abundance of $C_7H_x^+$ ions, since the parent molecule will be more readily cracked in the monomer mode. In some embodiments, monomer species of interest are obtained from gaseous- or liquid-phase materials such as $AsH_3$, $PH_3$, $BF_3$, $SiF_4$, Xe, Ar, $N_2$, $GeF_4$, $CO_2$, CO, $CH_3$, $SbF_5$, $P_4$, and $As_4$. In some embodiments, cluster species of interest are obtained from vaporized solid-feed materials, such as $B_{10}H_{14}$, $B_{18}H_{22}$, $C_{14}H_{14}$, and $C_{16}H_{10}$, and either gaseous- or liquid-phase materials, such as $C_6H_6$ and $C_7H_{16}$. These materials are useful as ionized implant species if the number of atoms of interest (B and C in these examples) can be largely preserved during ionization.

The control circuit can initiate one of the two modes by appropriately setting the operating voltages of the electron gun 104. As an example, to initiate the monomer mode, the control circuit can set i) the voltage of the emitter (Ve), such as the voltage of the cathode 302, to about −200 V, and ii) the voltage of the anode 304 (Va) to about 200 V. The monomer mode can also be initiated when Ve is set to approximately 0 V (i.e., plasma source mode), in which case there are substantially no ions created within the ionization chamber 102 by electron impact ionization. To initiate the cluster mode, the control circuit can set i) Ve to about −400 V, and Va to about 0 V.

Each ion type has its advantages. For example, a low-energy ion implantation process or a materials-modification process (e.g., amorphization implants) may prefer heavy molecular species containing multiple atoms of interest, such as boron and carbon in the examples provided above. In contrast, for doping a silicon substrate to create transistor structures (e.g., sources and drains), monomer species, such as $B^+$, may be preferred.

Figure 4:
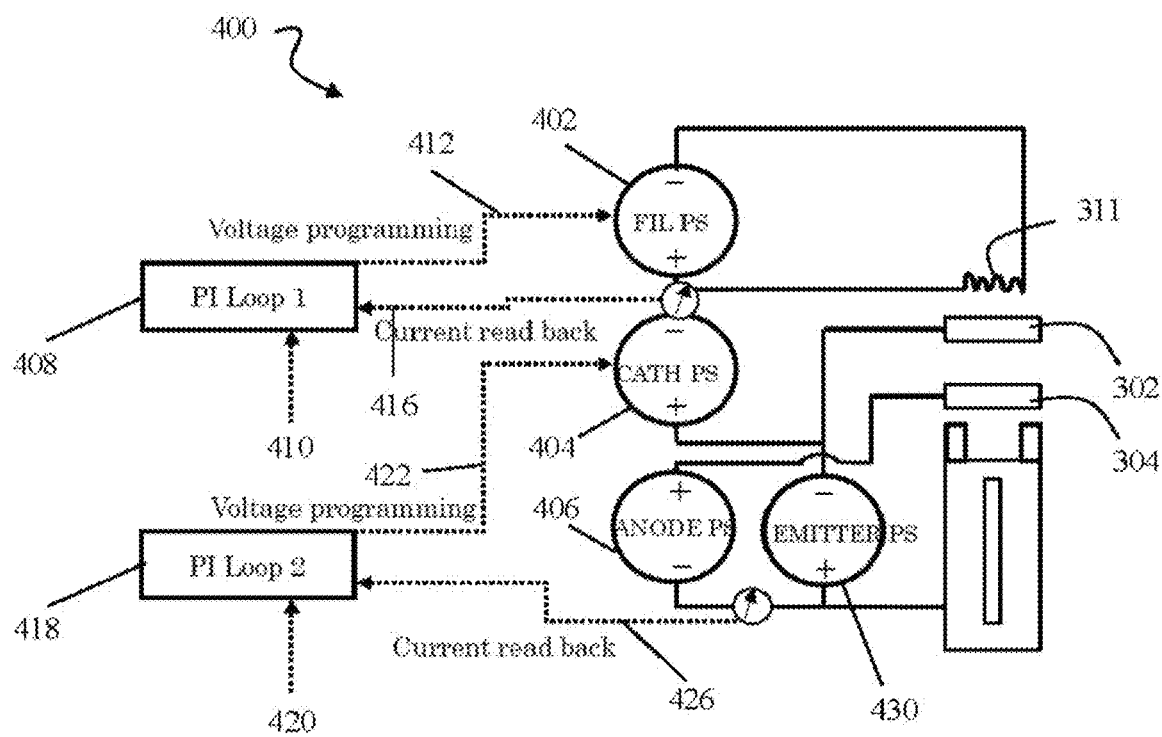
FIG. 4 shows a schematic diagram of an exemplary control system for the electron gun assembly of FIG. 3.

To control the operation of the electron gun 104 among the different modes of operation, the control circuit can regulate the current and/or voltage associated with each of the filament 311, the cathode 302, and the anode 304. FIG. 4 shows a schematic diagram of an exemplary control system 400 of the electron gun assembly 104 of FIG. 3, according to embodiments of the present invention. As illustrated, the control circuit 400 includes a filament power supply 402 for providing a voltage across the filament 311 (Vf) to regulate filament emission, a cathode power supply 404 (Vc) for biasing the filament 311 with respect to the cathode 302, an anode power supply 406 for providing a voltage to the anode 304 (V a), and an emitter power supply for providing a voltage of the emitter (V e), such as the voltage of the cathode 302. In general, each of the power supplies 402, 404, 406 can operate in the controlled current mode, where each power supply sets an output voltage sufficient to meet a setpoint current. As shown, the control circuit 400 includes two closed-loop controllers: 1) a closed-loop controller 408 used to regulate current emission by the filament 311, and 2) a closed-loop controller 418 used to regulate arc current generated in the secondary plasma 310, which is the current sourced by the anode power supply 406.

At the beginning of a control operation, the control circuit 400 sets the cathode power supply 404 and the anode power supply 406 to their respective initial voltage values. The control circuit 400 also brings the filament 311 into emission using a filament warm-up utility that is available through an operator interface, for example. Once emission is attained, an operator of the control circuit 400 can initiate closed loop control via controllers 408 and 418.

The closed-loop controller 408 seeks to maintain a setpoint emission current value for the filament 311, which is the electron beam-heating current delivered to the cathode 302. The closed-loop controller 408 maintains this current value by adjusting the filament power supply 402 to regulate filament voltage, i.e., the voltage across the filament 311. Specifically, the controller 408 receives as input a setpoint filament emission current value 410, which is the current sourced by the cathode power supply 404. The setpoint current value 410 can be about 1.2 A, for example. In response, the controller 408 regulates the filament power supply 402 via output signal 412 such that the filament power supply 402 provides sufficient output voltage to allow the current leaving the filament power supply 402 to be close to the setpoint current value 410. The actual current leaving the filament power supply 402 is monitored and reported back to the controller 408 as a feedback signal 416. A difference between the actual current in the feedback signal 416 and the setpoint current 410 produces an error signal that can be conditioned by a proportional-integral-derivative (PID) filter of the controller 408. The controller 408 then sends an output signal 412 to the filament power supply 402 to minimize the difference.

The closed-loop controller 418 seeks to maintain a setpoint anode current by adjusting the current generated by the electron beam 308, since the anode current is proportional to the electron beam current. The closed-loop controller 418 maintains this setpoint current value by adjusting the electron beam heating of the cathode 302 by the filament 311 so as to regulate the amount of electrons emitted by the cathode 302. Specifically, the controller 418 receives as input a setpoint anode current 420. In response, the controller 418 regulates the cathode power supply 404 via an output signal 422 such that the cathode power supply 404 provides sufficient output voltage to allow the current at the anode power supply 406 to be close to the setpoint current 420. As described above, by adjusting the voltage of the cathode power supply 404, the level of electron heating of the cathode 302 is adjusted, and thus the current of the electron beam 308. Since the arc current of the anode 304 is fed by the electron beam 308, the anode current is therefore proportional to the current of the electron beam 308. In addition, the actual current leaving the anode power supply 406 is monitored and reported back to the controller 418 as a feedback signal 426. A difference between the actual current in the feedback signal 426 and the setpoint current 420 produces an error signal, which is conditioned by a PID filter of the controller 418. The controller 418 subsequently sends an output signal 422 to the cathode power supply 404 to minimize the difference.

In some embodiments, the kinetic energy of the electron beam 308 can be determined by the control circuit based on measuring the voltage of the emitter power supply 430. For example, the electron beam energy can be computed as the product of emitter supply voltage (Ve) and electron charge (e). The emitter power supply 430 can also source the electron beam current, which is equivalent to the current leaving the emitter power supply 430, and serve as the reference potential for the cathode power supply 404 which floats the filament power supply 402.

With continued reference to FIG. 3, the ground element 306 of the electron gun 104 can be configured to decelerate the electron beam 308 by reducing the final energy of the electron beam 308 before it enters the ionization chamber 102. Specifically, the ground element 306 can include one or more lenses, such as two lenses, that are shaped according to a reverse-Pierce geometry to act as deceleration lens. As an example, the electron beam 308 may approach the ground element 306 at 500 eV, and decelerate to 100 eV after passing the ground element 306. As a result, a lower-energy electron current is introduced to the ionization chamber 102 than otherwise possible. In addition, an external, substantially uniform magnetic field 320 can be applied to confine the electron beam 308 to helical trajectories. The magnetic field 320 can also confine the primary plasma (not shown) and the secondary plasma 310 to inside of the ion source 100. Details regarding the magnetic field 320 are described below with reference to FIGS. 5-7.

At least one electron gun 104 of FIG. 3 can be used to introduce an electron beam and/or ions into the ionization chamber 102 via the aperture 312. The aperture 312 can allow transport of a gas from the ionization chamber 102 to the electron gun 104, from which the secondary plasma 310 in the electron gun 104 can be formed during the ion pumping mode. In some embodiments, two electron guns are used, each positioned on an opposite side of the ionization chamber 102, as shown in FIG. 1. The electron beam introduced by each of the pair of electron guns 104 is adapted to travel in the longitudinal direction 118 inside of the ionization chamber 102. The electron beam from each electron gun 104 ionizes the gas in the ionization chamber 102 to produce ions in the ionization chamber 102. Additional ions can be introduced by the electron guns 104 into the ionization chamber 102 if the ion pumping mode is activated.

In one aspect, one or more components of the ion source 100 are constructed from graphite to minimize certain harmful effects from, for example, high operating temperatures, erosion by ion sputtering, and reactions with fluorinated compounds. The use of graphite also limits the production of harmful metallic components, such as refractory metals and transition metals, in the extracted ion beam 116. In some examples, the anode 304 and the ground element 306 of the electron guns 104 are made of graphite. In addition, one or more electrodes used to extract ions from the ionization chamber 102 can be made of graphite, including the plasma electrode 106 and the puller electrode 108. Furthermore, the ionization chamber 102, which can be made of aluminum, can be lined with graphite.

Figure 5:
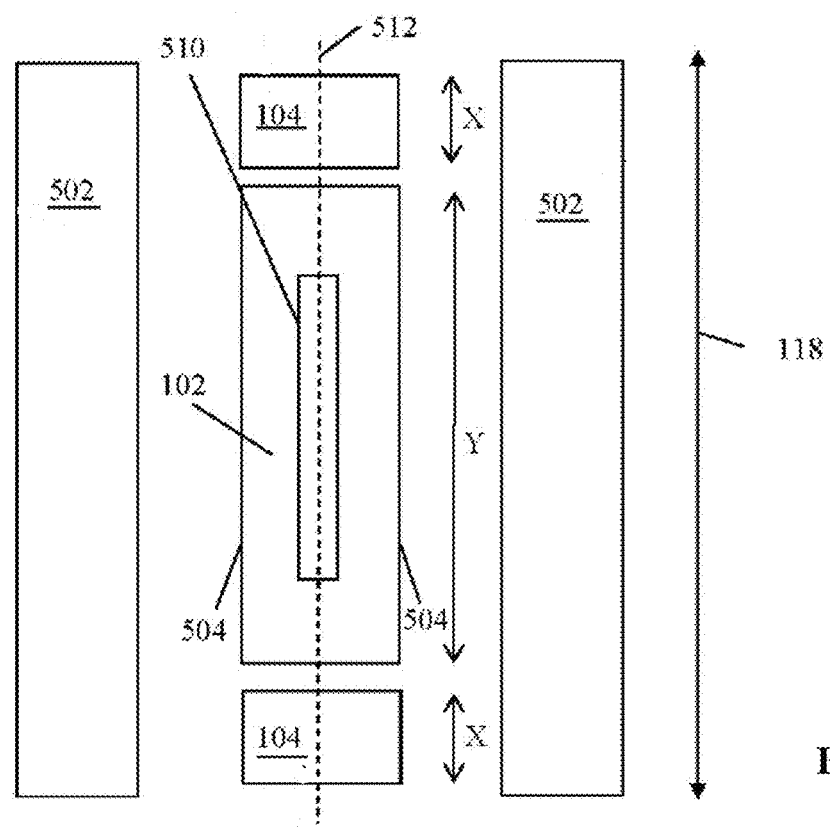
FIG. 5 shows a schematic diagram of an exemplary ion source including a pair of magnetic field sources.

In another aspect, the ion source 100 can include one or more magnetic field sources positioned adjacent to the ionization chamber 102 and/or the electron guns 104 to produce an external magnetic field that confines the electron beam generated by each of the electron guns 104 to the inside of the electron guns 104 and the ionization chamber 102. The magnetic field produced by the magnetic field sources can also enable the extracted ion beam 116 to achieve a more uniform ion density distribution. FIG. 5 shows a schematic diagram of an exemplary ion source including a pair of magnetic field sources, according to embodiments of the present invention. As illustrated, an external magnetic field can be provided by the pair of magnetic field sources 502 positioned on each side of the ionization chamber 102 parallel to the path of the electron beam 308, i.e., parallel to the longitudinal axis 118 of the ionization chamber 102. The pair of magnetic field sources 502 can be aligned with and adjacent to external surfaces of two opposing chamber walls 504, respectively, where the opposing chamber walls are parallel to the longitudinal axis 118. In some embodiments, at least a portion of the surface of the ionization chamber 102, except for the opposing chamber walls 504 and the sides opposing to the electron guns 104, can form the extraction aperture. FIG. 5 shows an exemplary placement of an extraction aperture 510 on a surface of the ionization chamber 102. The two magnetic field sources 502 can be symmetrical about the plane including the center axis 512 of the ionization chamber 102 parallel to the longitudinal axis 118. Each magnetic field source 502 can comprise at least one solenoid. One of the opposing chamber walls can define the extraction aperture. The two magnetic field sources 502 can be symmetrical about the longitudinal axis 118. Each magnetic field source 502 can comprise at least one solenoid.

The longitudinal length of each magnetic field source 502 is at least as long as the longitudinal length of the ionization chamber 102. In some embodiments, the longitudinal length of each magnetic field source 502 is at least as long as the lengths of the two electron guns 104 plus that of the ionization chamber 102. For example, the longitudinal length of each magnetic field source 502 can be about 500 mm, 600 mm, 700 mm or 800 mm. The magnetic field sources 502 can substantially span the ionization chamber's extraction aperture, from which ions are extracted. The magnetic field sources 502 are adapted to confine the electron beam 308 over a long path length. The path length is given by (2X+Y) as indicated in FIG. 5, where X is the extent of the electron gun 104, and Y is the extent of the ionization chamber 102 (Y is also roughly the length of the ion extraction aperture, and the desired length of the extracted ribbon ion beam 116).

Figure 6:
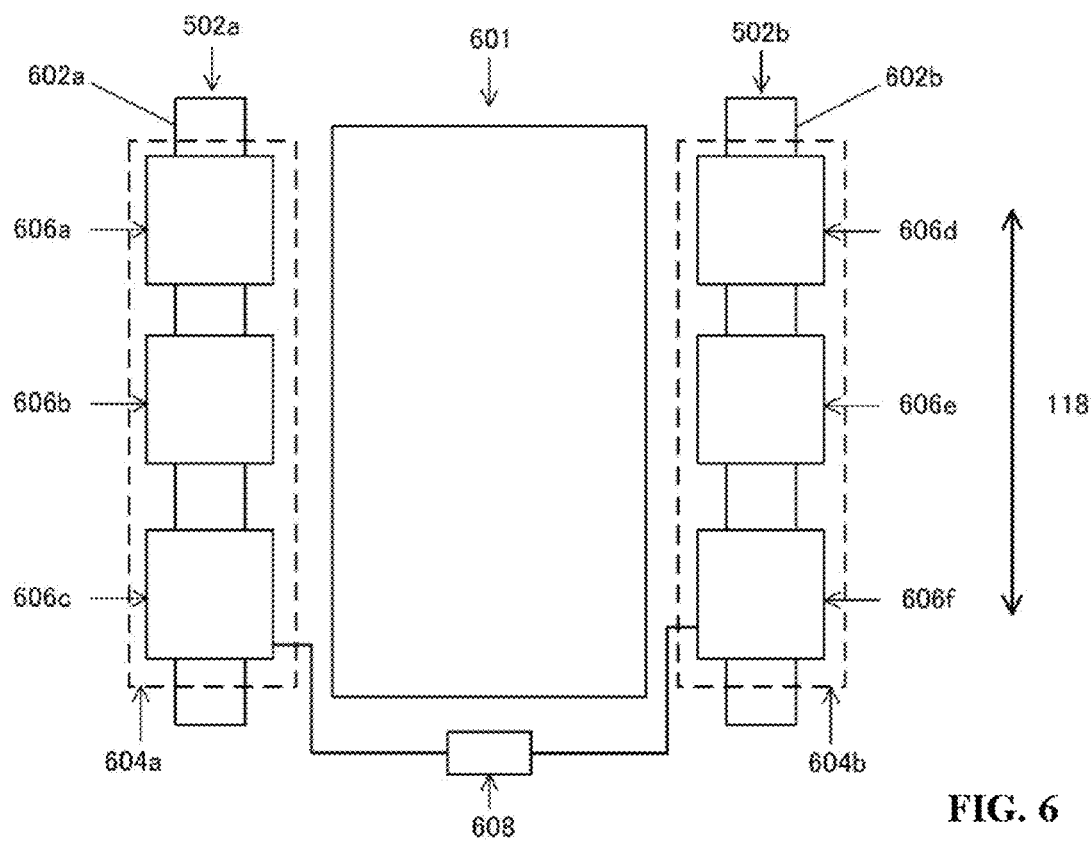
FIG. 6 shows a schematic diagram of an exemplary configuration of the magnetic field sources of FIG. 5.

FIG. 6 shows a schematic diagram of an exemplary configuration of the magnetic field sources 502 of FIG. 5, according to embodiments of the present invention. As shown, each magnetic field source 502a-b includes i) a magnetic core 602a-b, and ii) an electromagnetic coil assembly 604a-b generally wound around the core 602a-b. The ion source structure 601, including the ionization chamber 102 and the electron guns 104, is immersed in an axial magnetic field produced by the electromagnetic coil assemblies 604a-b. In some embodiments, neither of the pair of magnetic field sources 502a-b is connected to a magnetic yoke, such that the magnetic flux generated by the magnetic field sources 502a-b dissipates into space and returns far away from the ion source structure 601. This configuration produces a magnetic flux in the ion source structure 601 that has been found to introduce improved uniformity in the ion density profile of the extracted ion beam 116 in the longitudinal direction 118. In addition, the magnetic flux in the ion source structure 601 may be oriented in the longitudinal direction 118. In some embodiments, the two magnetic field sources 502a-b are physically distant from each other and their magnetic cores 602a-b are electrically isolated from each other. That is, there is no electrical connection between the pair of magnetic cores 602a-b.

Each coil assembly 604 can comprise multiple coil segments 606 distributed along the longitudinal axis 118 and independently controlled by a control circuit 608. Specifically, the control circuit 608 can supply a different voltage to each of the coil segments. As an example, the coil assembly 604a can comprise three coil segments 606a-c that generate independent, partially overlapping magnetic fields over the top, middle and bottom sections of the ion source structure 601. The resulting magnetic field can provide confinement of the electron beam 308 generated by each of the electron guns 104, and thus create a well-defined plasma column along the longitudinal axis 118.

The magnetic flux density generated by each of the coil segments 606 can be independently adjusted to correct for non-uniformities in the ion density profile of the extracted ion beam 116. As an example, for coil assembly 604a, the center segment 606b can have half of the current as the current supplied to the end segments 606a, 606c. In some embodiments, corresponding pairs of coil segments 606 for the pair of magnetic field sources 502 are supplied with the same current. For instance, coils 606a and 606d can have the same current, coils 606b and 606e can have the same current, and coils 606c and 606f can have the same current. In some embodiments, each of the coil segments 606a-f is supplied with a different current. In some embodiments, for a coil assembly 604a or b, each center coil 606b or e is operated at a lower current than the end coils 606a and c or 606 d and f. This can create a "magnetic bottle" effect that increases ionization efficiency. For example, each center coil 606b or e can be tuned to a low current, such as near or at zero current or reverse-biased (i.e., negative current), while the end coils 606a and c or 606 d and f are tuned to a higher current. In some embodiments, multiple control circuits are used to control one or more of the coil segments 606. Even though FIG. 6 shows that each coil assembly 604 has three coil segments 606, each coil assembly 604 can have more or fewer segments. In addition, the pair of coil assemblies 604 do not need to have the same number of coil segments 606. The number and arrangement of coil segments 606 for each coil assembly 604 can be suitably configured to achieve a specific ion density distribution profile in the extracted ion beam 116.

Figure 7:
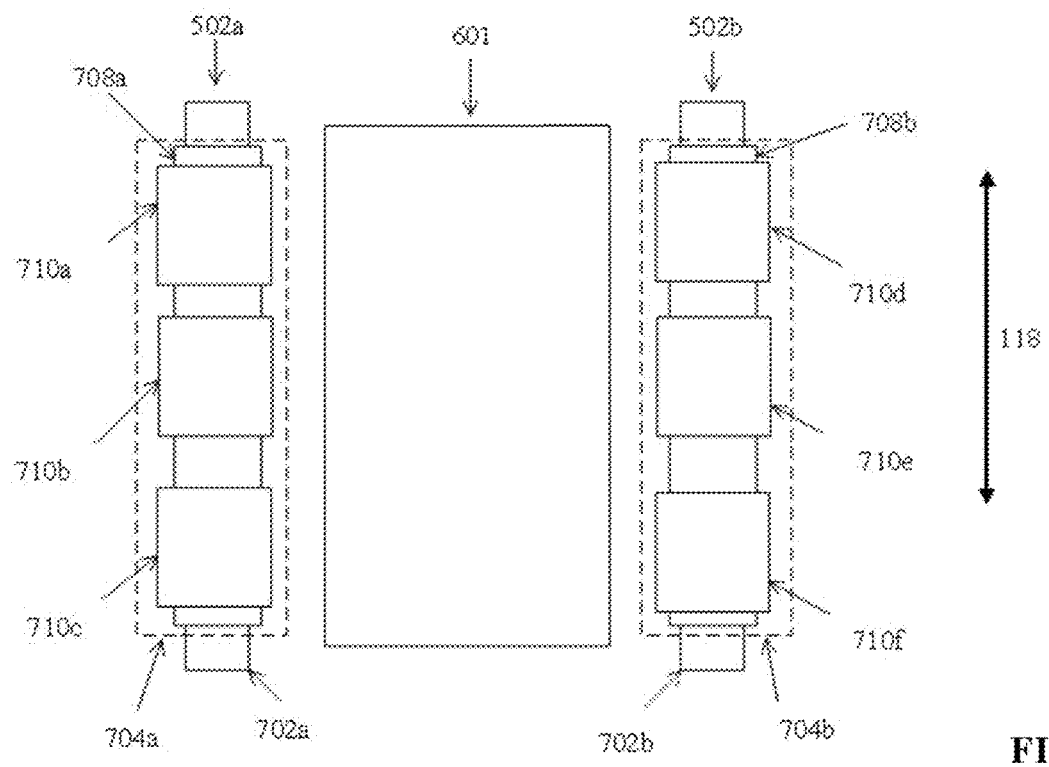
FIG. 7 shows a schematic diagram of another exemplary configuration of the magnetic field sources of FIG. 5.

FIG. 7 shows a schematic diagram of another exemplary configuration of the magnetic field sources 502 of FIG. 5, according to embodiments of the present invention. As illustrated, the coil assembly 704a-b of each magnetic field source 502a-b can include 1) a main coil segment 708a-b substantially wound around the corresponding magnetic core 702a-b, and 2) multiple sub coil segments 710a-f wound around the main coil segment 708a-b. Each of the main coil segment 708a-b and the sub coil segments 710a-f of each coil assembly 704a-b is independently controlled by at least one control circuit (not shown). This arrangement provides the operator with a greater flexibility in adjusting the magnetic flux generated by the magnetic field sources 502a-b, such that the resulting ion beam 116 has a desired ion density distribution in the longitudinal direction 118. For example, the main coil segments 708a-b can be used to provide rough control of the magnetic field in the ion source structure 601 while the sub coil segments 710a-f can be used to fine tune the magnetic field. In some embodiments, the longitudinal length of each main coil segment 708a-b is at least the length of the ionization chamber 102 while the length of each sub coil segment 710a-f is less than the length of the main coil segment 708a-b.

Figure 8:
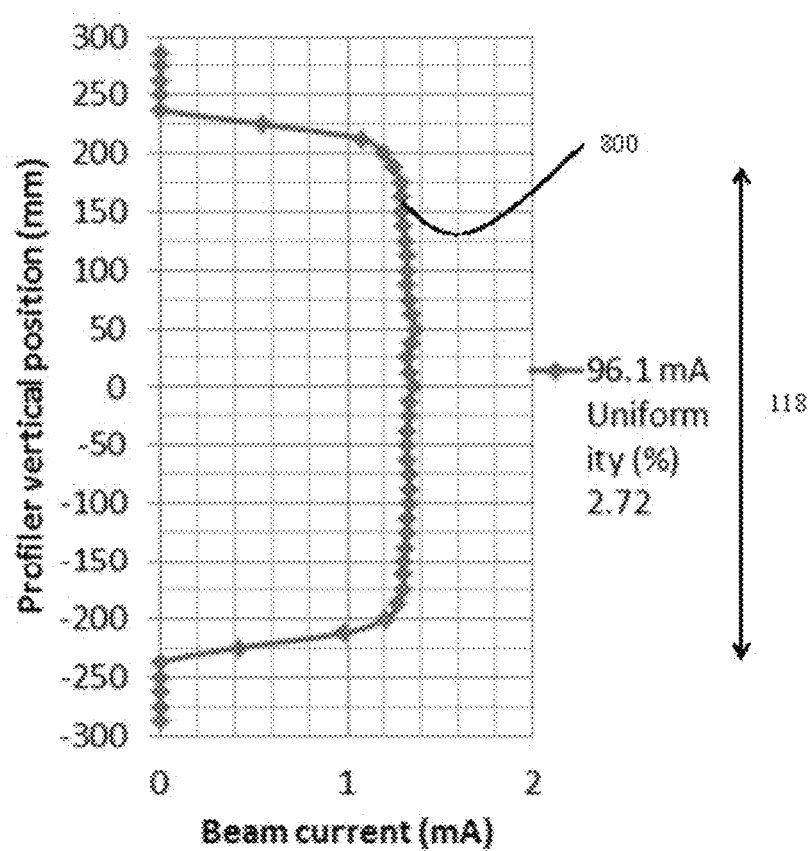
FIG. 8 shows a diagram of an exemplary ion density profile of an ion beam generated by the ion source of the present invention.

FIG. 8 shows a diagram of an exemplary ion density profile of an ion beam generated by the ion source 100. The profile shows the current density along the longitudinal axis 118. As illustrated, the total ion beam current 800 from the exemplary ion beam is about 96.1 mA and the current density is substantially uniform over a 400 mm length to within plus or minus about 2.72% along the longitudinal axis 118.

Figure 9:
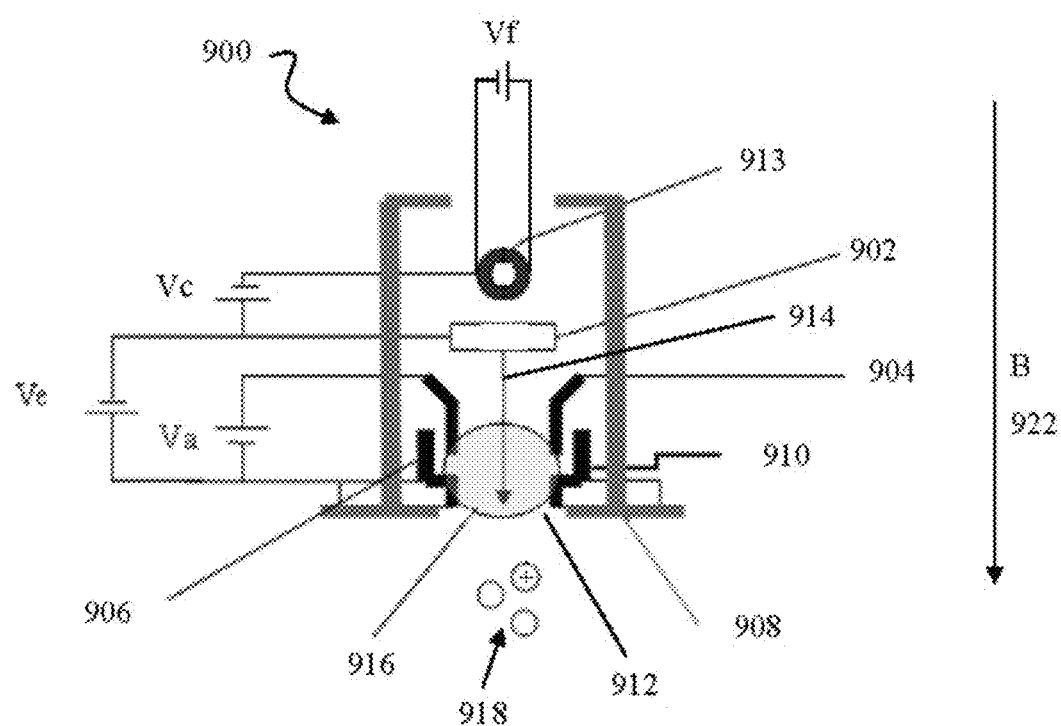
FIG. 9 shows a schematic diagram of another exemplary ion source.

FIG. 9 shows a schematic diagram of another exemplary ion source, according to embodiments of the present invention. The ion source 900 includes a cathode 902, an anode 904, a ground element 906, a magnetic field source assembly 908, and a gas feed 910. The cathode 902 can be substantially similar to the cathode 302 of FIG. 3, which can be heated directly or indirectly. If the cathode 902 is heated indirectly, a filament 913 can be used to perform the indirect heating. The cathode 902 is adapted to thermionically emit electrons, leading to the formation of an energetic electron beam 914 at the anode 904, which is held at a positive potential in relation to the cathode 902. In addition, similar to the electron gun arrangement 104 of FIG. 3, plasma 916 can be formed in the ion source 900 between the anode 904 and the ground element 906. The plasma 916 is created from the ionization of a gas that is introduced directly into the ion source 900 via the gas feed 910 through the ground element 906. The electron beam 914 can sustain the plasma 916 for an extended period of time. The plasma 916 is adapted to generate positively charged ions 918 that can be extracted at the aperture 912 by an extraction system (not shown) and transported to a substrate for implantation. An ionization chamber is not needed in the ion source 900. Therefore, the ion source 900 is relatively compact in design and deployment.

In some embodiments, at least one control circuit (not shown) can be used to regulate the current and/or voltage associated with each of the filament 912, the cathode 902, and the anode 904 to control the operation of the ion source 900. The control circuit can cause the ion source 900 to operate in one of the ion pumping mode or the plasma source mode, as described above. The control circuit can also adjust the flow rate of the gas feed 910 to regulate the quality of the extracted ion beam (not shown).

Optionally, the ion source 900 can include the magnetic field source assembly 908 that produces an external magnetic field 922 to confine the electron beam 914 to inside of the ion source 900. As illustrated, the magnetic field source assembly 908 comprises a yoke assembly coupled to permanent magnets to generate a strong, localized magnetic field 922, which can be parallel to the direction of the electron beam 914. Alternatively, an electromagnetic coil assembly, wound around a yoke structure, can be used. Thus, the incorporation of a large external magnet coil that is typical of many ion source systems is not needed. Such a magnetic field source assembly 908 terminates the magnetic field close to the ion source 900 so that it does not penetrate far into the extraction region of the ions. This allows ions to be extracted from a substantially field-free volume.

The ion source design of FIG. 9 has many advantages. For example, by localizing the ionization region of the ion source 900 within the emitter assembly (i.e., without using a large ionization chamber), the size of the ion source 900 is significantly reduced. In addition, by introducing a gas to the plasma 916 at its point of use, rather than into a large ionization chamber, gas efficiency is substantially increased and it contributes to the compact, modular design of the ion source 900. Furthermore, producing local magnetic confinement of the plasma 916 with appropriate field clamps enable ion current to be extracted from a substantially field-free zone.

In another aspect, the present invention features ion sources, which is a type of plasma generators, capable of producing little or no contaminants (e.g., refractory metal compounds) in the extracted ion beams so as to reduce metals contamination levels introduced into a workpiece.

Ion sources used in ion implanters are typically made of refractory metals. A typical Bernas-type or indirectly-heated-cathode (IHC)-type source, for example, contains a filament or indirectly-heated cathode made of a refractory metal such as tungsten. The ionization chamber is also typically metallic. For example, an ionization chamber can be constructed from a refractory metal such as molybdenum (or a molybdenum alloy such as TZM), or has chamber "liners" fabricated from a refractory metal such as tungsten. The reason that ion implantation ion sources are typically constructed from refractory metals is that the ion sources operate at elevated temperature. The filament or IHC of an ion source generates electrons by thermionic emission, and attains a temperature in excess of 2000 degrees Celsius to generate a significant electron current (e.g., several amperes of electron current is typically required). This electron current is used to generate a plasma from a process feed gas. Commonly used process gases include Ar, Xe, $BF_3$, $AsH_3$, $PH_3$, $GeF_4$, $SiF_4$, $N_2$, and $CO_2$, for example. These ion sources typically sustain plasma formation through an arc discharge, which can dissipate hundreds or thousands of watts of power, significantly heating the arc (or ionization) chamber of the ion source. Hereinafter, the terms "arc chamber" and "ionization chamber" are used interchangeably.

Figure 10:
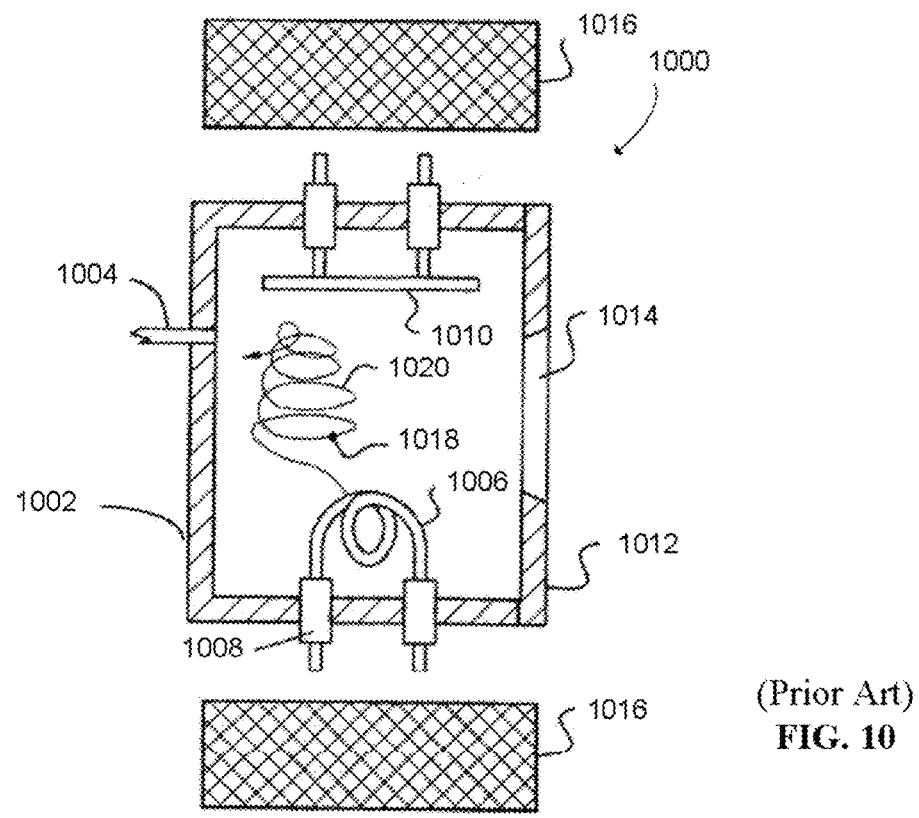
FIG. 10 shows an exemplary prior art Bernas-type ion source.
Figure 11:
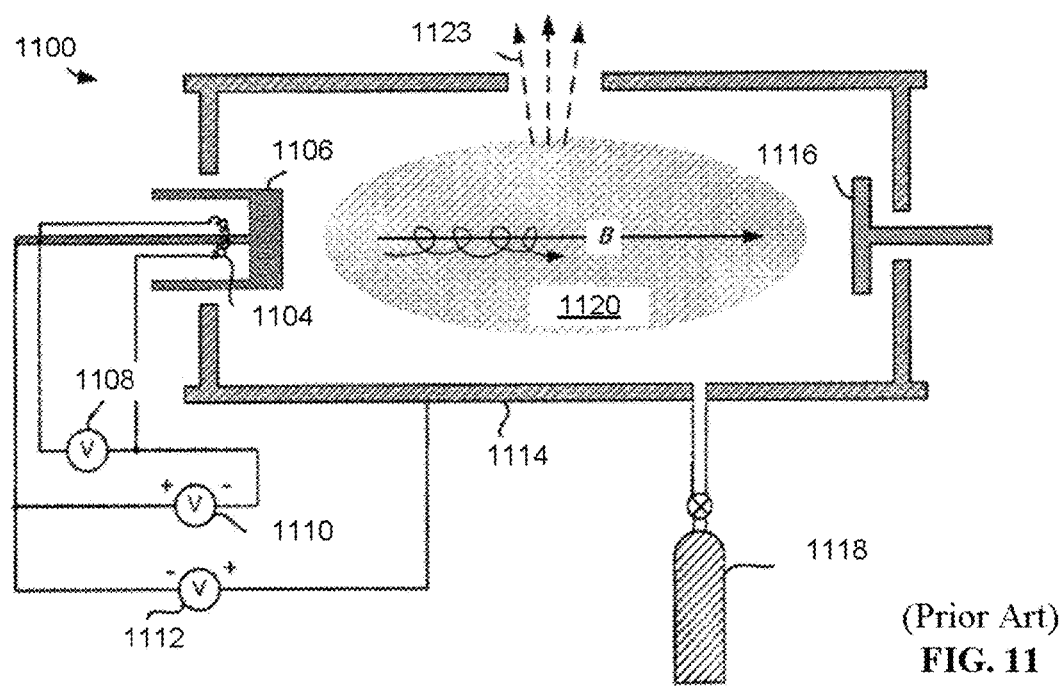
FIG. 11 shows an exemplary prior art IHC-type ion source.

An exemplary prior art Bernas-type ion source is illustrated in FIG. 10, and an exemplary prior art IHC-type ion source is illustrated in FIG. 11. As shown in FIG. 10, a prior art Bernas-type ion source 1000 can include an arc chamber 1002, feed gas inlet 1004, filament 1006, ceramic insulators 1008, repeller electrode 1010, source aperture plate 1012, source aperture 1014, and source magnet coils 1016. A pair of source magnet coils 1016 can produce a magnetic field along an axis joining the two coils. This magnetic field serves to confine electrons 1018 thermionically emitted from the heated filament 1006 to a helical path 1020. The filament 1006 can be held at a negative potential with respect to the arc chamber 1002 to provide the electrons 1018 with sufficient kinetic energy to ionize the feed gas introduced by the gas inlet 1004. The path length of the electrons 1018 can be increased by either applying a similar negative voltage to the repeller electrode 1010 to repel the electrons, or the repeller electrode 1010 can be self-biasing, i.e., insulated from electric potential. Eventually, the electrons 1018 are adapted to impinge on the walls of the arc chamber 1002 along the electron path 1020 and are lost. The current associated with this electron loss is measured as an "arc current." Such design of the ion source 1000 is known as a "reflex geometry," since the thermionically-emitted electrons can travel back and forth between the filament 1006 and the repeller electrode 1010 before being lost. This action can create a dense plasma comprising thermalized electrons and ionized feed gas. Positively-charged ions from this plasma can be extracted through the source aperture 1014 by electrostatic ion optics (not shown) biased to a negative potential with respect to the arc chamber 1002.

Typically, the filament 1006, the repeller electrode 1010, the arc chamber 1002, and the source aperture plate 1012 are made from refractory metals, with the filament 1006 and the repeller electrode 1010 made of tungsten and the arc chamber 1002 made of molybdenum, for example. Also, the ceramic insulators 1008 are commonly fabricated from Al₂O₃ or BN. Thus, these metals (or metal-bearing compounds) are continually exposed to the source plasma.

FIG. 11 shows an exemplary IHC-type source. The ion source 1100 incorporates an indirectly-heated cathode (IHC), and is thus generally referred to as an IHC source. The main difference between the IHC source 1100 and the Bernas source 1000 of FIG. 10 is the replacement of the naked, immersed filament 1006 (e.g., a bare tungsten filament) of the Bernas source 1000 with an IHC-type electron emitter. As shown in the exemplary IHC source configuration 1100 of FIG. 11, the cathode 1106 can be biased to a negative potential with respect to the arc chamber 1114 by power supply 1112. The filament 1104 can be biased negative with respect to the cathode 1106 by the power supply 1110. Heating of the filament 1104 by the power supply 1108 causes the filament 1104 to emit electrons, which are accelerated towards the cathode 1106, thereby heating the cathode 1106 by electron beam heating. Thus, the cathode 1106 can be heated to incandescence, and it in turn thermionically emits electrons into the arc chamber 1114, confined by a magnetic field, as is in the case of the Bernas source 1000 of FIG. 10. The electrons, thus confined, can execute a helical trajectory, and can be repelled by the repeller electrode 1116 in a reflex geometry. The confined electrons can create a plasma column 1120 by ionizing feed gas introduced into the arc chamber 1114 from the cylinder 1118. The resulting ions 1123 can be extracted from the plasma 1120 by electrostatic optics (not shown). The cathode 1106, repeller electrode 1116, and arc chamber 1114 are typically made from refractory metals, and are continually exposed to the source plasma.

Figure 12:
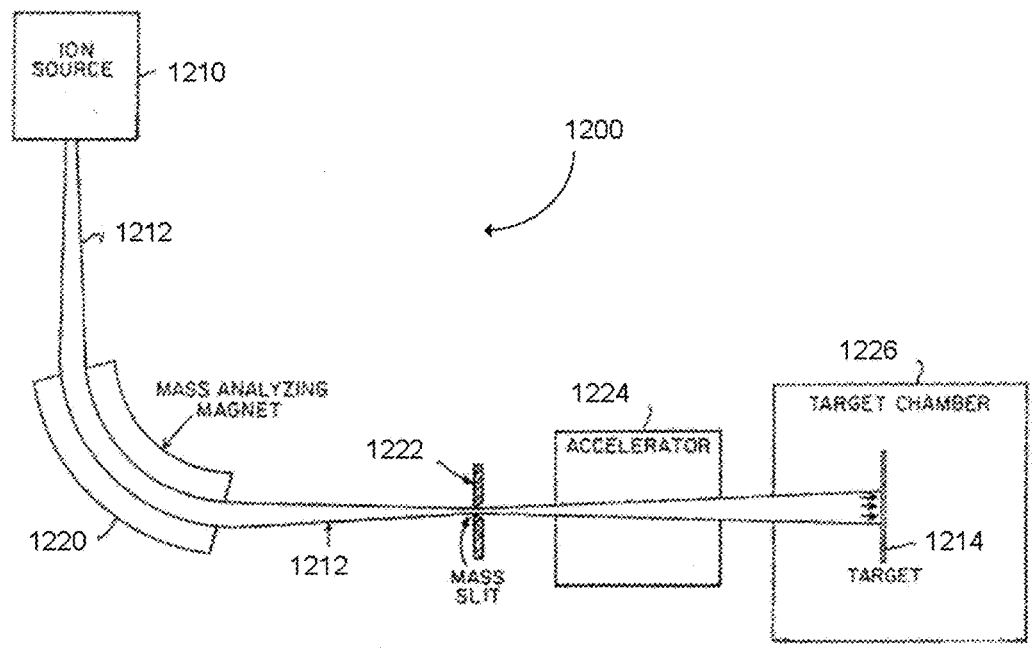
FIG. 12 shows an exemplary high current implanter.

FIG. 12 illustrates an exemplary ion implanter 1200 (e.g., a high current implanter). In operation, the plasma ions generated in the ion source 1210 can be extracted by electrostatic optics (not shown) to generate an energetic ion beam 1212 ranging in energy from a few keV to about 100 keV. The ion beam 1212 is transported and focused by a mass analyzing magnet 1220, which can be configured to spatially separate or disperse ion species according to their mass-to-charge ratio. Once spatially separated, the ion beam 1212 can be blocked by a mass resolving aperture (MRA) or mass slit 1222, which includes an elongated slot, such that only ions which are not blocked by this slot are transmitted downstream in the implanter, where the ion beam 1212 is accelerated to a desired energy by the accelerator 1224 and ultimately impinges on a workpiece 1214 for implantation by the selected ions. The workpiece 1214 can be located within a target chamber 1226. In FIG. 12, the region between the ion source 1210 and the workpiece 1214 can be maintained at high vacuum during ion implantation. In some embodiments, the ion source 1210 is substantially similar to or the same as one of ion sources described above, such as the ion source 100 of FIG. 1, the ion source 601 of FIG. 6, the ion source 900 of FIG. 9, the ion source 1000 of FIG. 10 or the ion source 1100 of FIG. 11.

Figure 13:
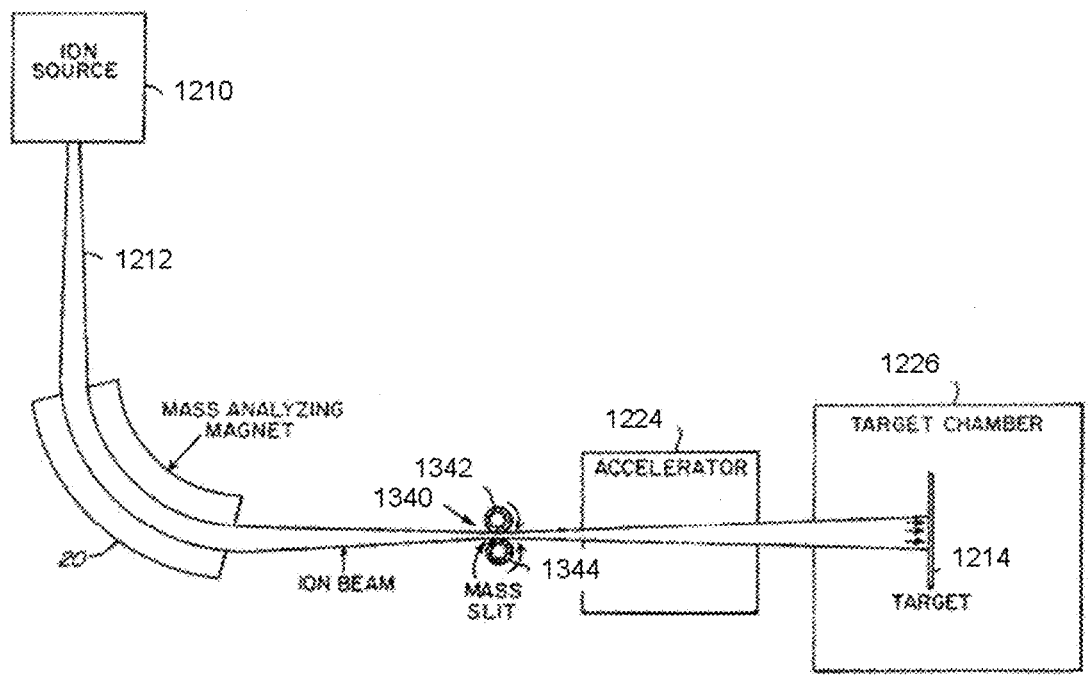
FIG. 13 shows another exemplary high current implanter.

FIG. 13 shows another exemplary ion implanter with an alternative mass resolving aperture (MRA). The ion implanter configuration of FIG. 13 is substantially identical that of FIG. 12, with the exception of the mass slit 1222 of FIG. 12 being replaced by a mass slit assembly 1340 that comprises two counter-rotating cylinders 1342 and 1344. This change serves to both reduce the operating temperature of the surface of the mass slit assembly 1340 relative to that of mass slit 1222, and to provide a greater surface area for the deposit of ion beam contaminants, i.e., the unwanted portion of the ion beam 1212. In addition, the direction of cylinder rotation of the mass slit assembly 1340 can provide a momentum to eject those unwanted particles, generally carrying them either upstream of the beam direction or to adjacent surfaces.

Design changes in the mass slit assembly 1340 of FIG. 13 in comparison to the mass slit 1222 of FIG. 12 are mainly motivated by the considerable wafer contamination experienced due to slit erosion in an ion implanter. Contamination of semiconductor wafers being implanted is highly undesirable. Furthermore, contamination standards have become increasingly strict as feature sizes of semiconductor devices have been reduced.

The degree of ion selection is limited by the "mass resolution" of the ion implanter, which is related to both the width of the MRA slot (e.g., MRA 1222 or 1340) and the optical qualities of the ion beam, including the degree of mass dispersion introduced by the electromagnet. A mass resolution can be defined by the dimensionless quantity $M/\Delta M$, where M is the mass of the ion of interest (in amu), and $\Delta M$ is the width (in amu) transmitted by the MRA when the electromagnet current is set to transmit the ion mass of interest. In commercial high current implanters, a value of $M/\Delta M$ is typically about 50.

This mass selection approach (also known as the mass-to-charge ratio selection approach) ideally produces a pure ion beam which contains only the ion of interest, for example, $B^+$ ions from $BF_3$ feed gas. In practice, however, the ion beam contains contaminants which are introduced through various means, including (i) sputtering of surfaces with which the beam has interacted prior to mass selection, such as surfaces of the mass resolving aperture (e.g., mass resolving aperture 1222 or 1340); (ii) mass interferences, whereby ion species created in the ion source undergo charge-exchange reactions during beam transport, so that their mass-to-charge ratio may be close to that of the selected ion; (iii) creation and transport of multiply-charged species that are not blocked by the mass resolving aperture; or (iv) a combination of the above.

In addition, many of the commonly used process feed gases include halogen gases (e.g., F or Cl), which readily react with refractory metals and are adapted to create compounds such as $WF_6$ and its derivatives (e.g., $WF_x^{q+}$, where q is an integer and x an integer less than 6). In addition, metals from the IHC and filaments are evaporated directly into the plasma, or are eroded by plasma ion sputtering. Therefore, much of the materials making up metal filaments, IHC's and arc chambers or source liners can be eroded by their end of life. Over time, the beam line of ion implanters can become contaminated by refractory metal compounds, ensuring that at least some of those metals are transported to, or sputtered onto, the workpiece. If the workpiece is a silicon wafer used to fabricate integrated circuits such as microprocessors, memory chips, or CMOS image sensors, the presence of even a few ppm of refractory metals or transition metals can negatively affect yield. For example, in the case of CMOS image sensors, even a single tungsten atom implanted into a device pixel can cause a "white spot" or dead pixel. Therefore, there is a need for ion sources that contain little or no metals in contact with the source plasma to reduce metals contamination levels introduced into semiconductor device wafers.

The present invention features a plasma generator, in the form of an ion source according to some embodiments, which produces little or no metal contaminants in the extracted ion beam. In general, the ion source can include an ionization chamber for forming a source plasma that can in turn generate multiple ions and electrons, one or more gas inlets for introducing a feed gas, one or more thermionic emitters, and an ion extraction aperture through which ions generated by the source plasma can be extracted to form an ion beam of substantially no metal.

In some embodiments, an ion source is constructed such that at least one interior surface (e.g., substantially all interior surfaces) of the ion source that are in contact with the source plasma are fabricated of materials containing substantially no metals. In general, the materials used to fabricate parts whose surfaces are in direct contact with the source plasma are selected from a group of materials of the form $X_mY_n$, C or B, where m and n are integers (including zero), X and Y are nonmetallic elements, C is carbon in various forms, including diamond, and B represents boron. In some embodiments, X and Y are selected from the materials Si, N, and C. In some embodiments, the thermionic emitter of the ion source remains metallic, made from a refractory metal such as tungsten. In general, certain materials that are sometimes referred to as semi-metals, such as B, graphite, and graphene, are classified as non-metal in the present invention and are usable to construct one or more components of an ion source to minimize metal contamination in the resulting ion beams.

Exemplary fabrication materials include silicon carbide (SiC), silicon nitride ($Si_3N_4$), graphite, graphene, and vitreous carbon. These materials are refractory and non-contaminating as they do not contain metal contaminants. Specifically, their maximum service temperature is above the service temperature of the ion source parts that are fabricated from the materials. SiC and C are appropriate materials for thermionic emitters such as IHC's and/or filaments. These materials are also appropriate for arc chamber liners, repellers and/or plasma electrodes. Stoichiometric SiC is a wide band gap semiconductor, has a very high melting point (e.g., above 3000 C), and can be doped (e.g., with N) to increase electrical conductivity. Sintered or amorphous C is a nonmetallic conductor, while crystalline diamond is a semiconductor. Both SiC and C are in wide industrial use, and are readily available. $Si_3N_4$ is an excellent ceramic insulator, and extremely hard. It is commonly used in industrial applications such as wear parts in the automotive industry. It is suitable as a replacement for alumina ($Al_2O_3$) if exposed insulators are required, for example as depicted in the ion source of FIG. 10. $Si_3N_4$ is also an appropriate ionization chamber liner material because such liners need not be electrically conductive.

In some embodiments, fabrication materials including one or more of the elements Al and B are permitted. Since these materials are electrical dopants in silicon, they are not as detrimental to device yields as transition metals, refractory metals, and noble metals. Examples of such materials include $Al_2O_3$, AlN, B, BN, and $B_4C$.

The components in Bernas and IHC-type ion sources that are typically exposed to the source plasma include the filament (in Bernas sources), IHC cathode (in IHC sources), repeller, arc chamber (or arc chamber liners, if used), and source extraction aperture plate (sometimes referred to as the plasma electrode). In some embodiments, at least one of (e.g., all of) these components is fabricated from one or more of the above-named classes of materials, resulting in an ion source configuration that minimizes metal contribution into the source plasma. Thus, minimal ion source-generated metals can propagate to the wafer, significantly improving ion implantation of semiconductor devices and reducing yield loss. As an example, all components of an ion source that have at least one surface in direct contact with source plasma are fabricated from the above-named classes of materials, except for the thermionic emitter, which can be made from a refractory metal (e.g., tungsten). In some embodiments, the non-metallic materials used to fabricate plasma-facing components of an ion source are the same. Alternatively, the non-metallic materials for different ion source components are different. For example, the interior surface (e.g., liners) of the ionization chamber being exposed to the source plasma can be made of the same material as or a different material from that of the thermionic emitter, which can also include at least one surface exposed to the source plasma. In addition, the repeller can be made of the same non-metallic material as the interior surface of the ionization chamber and/or the thermionic emitter, or of an entirely different non-metallic material.

FIGS. 14a and b show cross-sectional views of an exemplary ion source 1401 in the X-Y plane and Y-Z plane, respectively, where the ion source 1401 is configured to produce little or no metal containments in the extracted ion beam. Two indirectly-heated cathode (IHC) assemblies 1400a, 1400b are disposed opposite each other at each end of an elongated ionization chamber 1410. The IHC assemblies 1400a, 1400b include filaments 1402a, 1402b, emitters 1404a and 1404b, and tubular emitter holders 1406a, 1406b, respectively. In the embodiment of FIGS. 14a and b, the emitter 1404 is separate from the tubular emitter holder 1406. Alternatively, the emitter 1404 and tubular emitter holder 1406 are fabricated from a single piece of stock. The advantage of a two-piece design is that the emitter 1404 and tubular emitter holder 1406 can be fabricated from different materials, whereas the advantage of a one-piece design is ease of construction and improved reliability.

The emitters 1404a, 1404b can be constructed from SiC or C. The tubular emitter holders 1406a, 1406b can be constructed from SiC or C. In the event that the IHC assembly 1400 is designed such that the tubular emitter holder 1406 is not in contact with the source plasma, alternative materials can be used for the tubular emitter holders 1406a, 1406b, such as molybdenum or tungsten.

The IHC assemblies 1400a, 1400b are in close proximity to anodes 1408a, 1408b, respectively. The anodes 1408a, 1408b are in close proximity to ground elements 1412a, 1412b, respectively. In some embodiments, the collection of the IHC assembly 1400, anode 1408, and ground element 1412 forms an electron gun assembly 1414. Thus, in FIGS. 14a and b, there are two electron gun assemblies 1414a, 1414b disposed opposite of each other at each end of the ionization chamber 1410.

The electron beam generated by the electron guns 1414 can be confined by an externally generated magnetic field (indicated as B in FIG. 14a) directed along a line joining the two opposed electron guns 1414, indicated in FIGS. 14a and b as the Y-direction. In the presence of the magnetic field, electrons in the electron beam are adapted to execute helical trajectories, confining the electron beam to a narrow column along the Y-direction. When a gas is introduced into the ionization chamber 1410, for example by gas inlets 1440a to 1440e in FIG. 14b, the gas can be ionized by the electron beam by electron impact ionization, creating a source plasma. Ions can be extracted from a plasma electrode aperture 1430 by an extraction electrode (not shown) to form an energetic ion beam 1450.

As shown in FIG. 14b, the direction of the extracted ion beam 1450 is along the Z-axis. A plasma electrode 1432 is shown with its plasma electrode aperture 1430. The plasma electrode 1432 can be constructed of graphite, SiC, or SiC-coated graphite, for example. The five process gas inlets 1440, indicated as 1440a, 1440b, 1440c, 1440d, and 1440e, distribute process gas along the length of ionization chamber 1410. Although not indicated in FIG. 14 and b, the flow rate of process gas through each of the five process gas inlets 1440 can be individually controlled in a manner similar to the control scheme described with respect to the ion source 100 of FIG. 1, such that the uniformity of plasma density along the length of ionization chamber 1410 can be adjusted.

The ionization chamber 1410 of the ion source 1401 can be made of aluminum, but can also be fabricated of refractory metal such as tungsten, molybdenum, or molybdenum alloy. Substantially all the internal surfaces of the ionization chamber 1410 can be covered by liners 1420 fabricated from a nonmetallic material, such as SiC, C, or $Si_3N_4$. In some embodiments, liners 1420 are fabricated of graphitic or vitreous carbon coated by a SiC film. In some embodiments, substantially all surfaces of the ion source 1401 that contact the source plasma are constructed of materials that do not contain metals.

In some embodiments, the control system 400 of FIG. 4 can be used to operate the ion source 1401 of FIGS. 14a and b. In an exemplary operation of the ion source 1401 of FIGS. 14a and b, each of the filaments 1402 is heated to incandescence by a power supply (not shown), thereby emitting electrons. Each filament 1402 can be biased by a second power supply (e.g., by the filament power supply 402 of FIG. 4) to between 500V and 600V negative with respect to the respective emitter 1404, so that electrons emitted from the filament 1402 are accelerated to the emitter 1404. The emitter 1404 is thus heated by electron bombardment to incandescence so that the emitter 1404 emits electrons. Each emitter 1404 is biased negative with respect to the ionization chamber 1410 by a third power supply (e.g., by the emitter power supply 430 of FIG. 4), so that electrons emitted by the emitter 1404 are accelerated into the ionization chamber 1410. The kinetic energy K of the accelerated electrons is given by K=eV, where K is the electron kinetic energy, e is the electronic charge ($1.602 \times 10^{-19}$ C), and V is the output voltage of the power supply biasing the emitter 1404.

In addition, each anode 1408 can be biased positive with respect to the ionization chamber 1410 by a fourth power supply (e.g., by the anode power supply 406 of FIG. 4), to a value between zero volts and 200V. The anode 1408 is followed by ground element 1412, which is in direct contact with the ionization chamber 1410, and hence at ionization chamber potential. Thus, the emitter 1404, anode 1408, and ground element 1412 comprise a triode lens structure. The function of this triode lens is at least twofold:

1) the triode lens creates an electrostatic lens that shapes the electron beam emitted by the emitter 1404, helping to focus the electron beam in the presence of space charge forces; and/or
2) the triode lens creates an electrostatic barrier (for positive values of the anode voltage) against backstreaming ions originating from within the volume of the ionization chamber 1410. Since the kinetic energy of plasma ions within the volume of the ionization chamber 1410 is small, values of the anode voltage above about 20V are sufficient to establish the electrostatic barrier.

FIG. 15 illustrates another exemplary ion source 1500, incorporating one emitter and one repeller. In comparison to the ion source 1401 of FIGS. 14a and b, the ion source 1500 has one of the IHC assemblies replaced by a repeller 1535. For example, the repeller 1535 can be inserted in the position occupied by the anode 1408a in FIGS. 14a and b. Those components of the ion source 1500 that are substantially similar or the same as the components of the ion source 1401 have the same labels as their counterpart components of FIGS. 14a and b. The repeller 1535 can be self-biasing, that is, electrically isolated from the ionization chamber 1410 and ground electrode 1412a, or can be held at a negative potential with a value similar to that of the emitter 1404.

Due to the design of the ion sources 1401, 1500 of FIGS. 14a and b and 15, which incorporate one or more electron guns in the manner described above, the lengths of both the ion sources 1401, 1500 (hereby defined as the dimension of the ion sources along the Y-direction, indicated as L in FIG. 14a, for example) and the lengths of the plasma electrode apertures 1430 are scalable. That is, their lengths can be adjusted to support the formation of an extracted ion beam of between about 50 mm and about 1000 mm in length. In the ion sources 1401, 1500 depicted in FIGS. 14a and b and 15, the plasma electrode aperture lengths can be between about 200 mm and about 400 mm. This exemplary range is appropriate for producing an ion beam to implant 300 mm and 450 mm diameter silicon wafers.

The ionization chambers 1410 of the ion sources 1401, 1500 of FIGS. 14a and b and 15 are typically made of aluminum, but can also be fabricated of refractory metal such as tungsten, molybdenum, or molybdenum alloy. Substantially all the internal surfaces of each ionization chamber 1410 can be covered by liners 1420 fabricated from the nonmetallic materials described above, such as SiC, C, or $Si_3N_4$. In some embodiments, liners 1420 are fabricated of graphitic or vitreous carbon coated by a SiC film. In some embodiments, substantially all surfaces of each ion source that contact the source plasma are constructed of materials that do not contain metals.

In some embodiments, prior art ion sources, such as ion sources 1000, 1100 depicted in FIGS. 10 and 11, are modified by fabricating those structures that are exposed to the source plasma from nonmetallic materials heretofore named. FIG. 16 shows an exemplary Bernas ion source 1600 modified from the ion source 1000 of FIG. 10 to ensure that no or little metals are in direct contact with source plasma. Specifically, the Bernas source 1000 of FIG. 10 is modified so that metals are removed from contact with the source plasma. For example, one or more arc chamber liners 1602 can be added to the interior of the arc chamber 1002, where the arc chamber liners 1602 substantially cover the interior surface of the arc chamber 1002 that is directly exposed to a source plasma. The arc chamber liners 1602 can be fabricated from a non-metallic material described above, such as SiC, C, or $Si_3N_4$. The source aperture plate 1614, modified from the source aperture plate 1014 of FIG. 10, can be constructed of SiC or C. The filament 1606, modified from the filament 1006 of FIG. 10, can be fabricated of SiC or C. The repeller 1610, modified from the repeller 1010 of FIG. 10, can be fabricated of SiC, C, or $Si_3N_4$. The ceramic insulators 1608, modified from the insulators 1008 of FIG. 10, can be fabricated of $Si_3N_4$.

In some embodiments, these substitute materials can include Al or B. For example, the arc chamber liners 1602 can be fabricated of SiC, C, $Si_3N_4$, $Al_2O_3$, AlN, B, BN, or $B_4C$. The source aperture plate 1612, modified from the source aperture plate 1012 of FIG. 10, can be constructed of SiC, C, B, or $B_4C$. The filament 1606 can be fabricated of SiC or C. The repeller 1610 can be fabricated of SiC, C, $Si_3N_4$, $Al_2O_3$, AlN, B, BN, or $B_4C$. The ceramic insulators 1608 can be fabricated of $Si_3N_4$, $Al_2O_3$, AlN, or BN.

Figure 17:
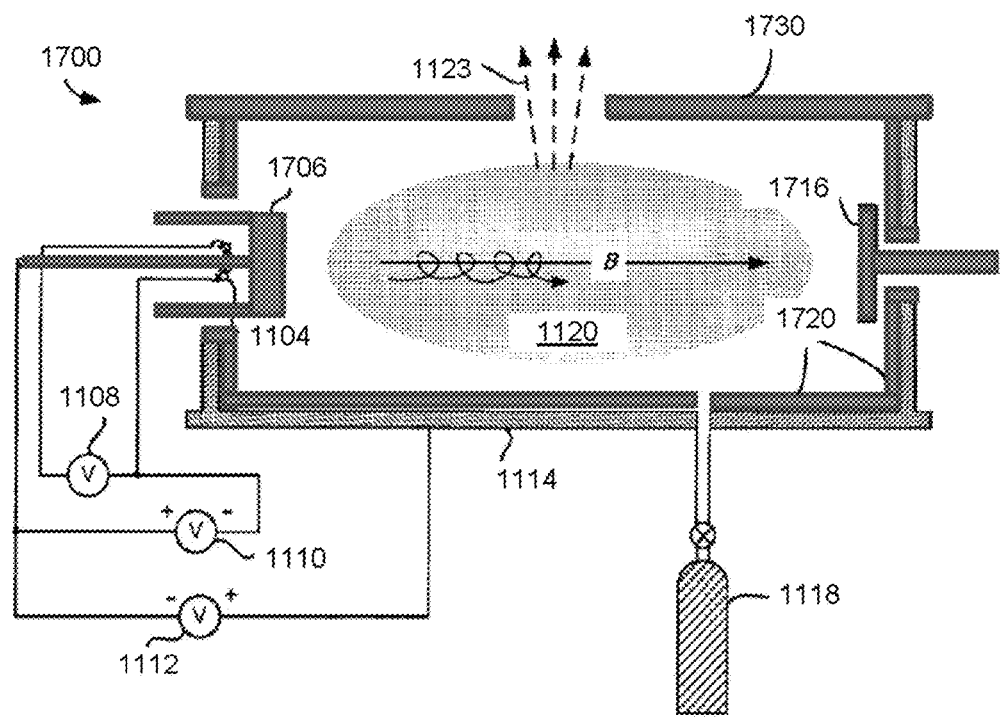
FIG. 17 shows an exemplary IHC ion source modified from the ion source of FIG. 11.

FIG. 17 shows an exemplary IHC ion source 1700 modified from the ion source 1100 of FIG. 11 to ensure that little or no metals are in direct contact with the source plasma. Specifically, the IHC source 1100 of FIG. 11 is modified so that metals are removed from contact with the source plasma. For example, one or more arc chamber liners 1720 can be added to the interior walls of arc chamber 1114, where the arc chamber liners 1720 can be fabricated of SiC, C, or $Si_3N_4$. A source aperture plate 1730 can be constructed of SiC or C. The cathode 1706, modified from the cathode 1106 of FIG. 11, can be fabricated of SiC or C. The repeller 1716, modified from the repeller 1116 of FIG. 11, can be fabricated of SiC, C, or $Si_3N_4$.

In some embodiments, these substituted materials can include Al or B. For example, the arc chamber liners 1720 can be fabricated of SiC, C, $Si_3N_4$, $Al_2O_3$, AlN, B, BN, or $B_4C$. The source aperture plate 1730 can be constructed of SiC, C, B, or $B_4C$. The cathode 1706 can be fabricated of SiC, C, or $B_4C$. The repeller 1716 can be fabricated of SiC, C, $Si_3N_4$, $Al_2O_3$, AlN, B, BN, or $B_4C$.

In some embodiments of the ion sources shown in FIGS. 14 through 17, the thermionic emitter (e.g., the thermionic emitter 1404 of FIGS. 14*a* and *b* or 15, the filament 1606 of FIG. 16 or the cathode 1706 of FIG. 17) can be fabricated from a refractory metal, while all other surfaces exposed to the source plasma are fabricated from metal-free materials, such as those named above. It may be advantageous to incorporate a refractory metal emitter (e.g., composed of tungsten or tantalum) into certain ion source designs (e.g., the ion source 1401 of FIGS. 14*a* and *b* or the ion source 1500 of FIG. 15), where the thermionic emitter is located outside of the ionization chamber. Such location of the thermionic emitter reduces refractory metal contamination of the source plasma in comparison to ion source designs in which the thermionic emitter is immersed in the ionization chamber. In some embodiments of ion sources, such as those depicted in FIGS. 16 and 17, the use of a refractory metal emitter may provide benefits including long service lifetime and/or resistance to certain corrosive process gases in comparison to using non-metallic materials such as carbon.

In another aspect, the present invention features plasma electron floods, which is a type of plasma generator, capable of producing little or no contaminants (e.g., refractory metal compounds) in the extracted electron flux so as to reduce metals contamination levels introduced into a workpiece.

Many plasma electron floods used in ion implanters incorporate refractory metals. A typical plasma electron flood, for example, can contain a filament or indirectly-heated cathode (IHC) made of a refractory metal such as tungsten. A filament-based or an IHC of a filament-based plasma electron flood generates electrons by thermionic emission and can attain a temperature in excess of 2000 degrees Celsius to produce a significant electron current (e.g., about one ampere or more of electron current is typically required). This electron current is used to generate plasma from a feed gas. Commonly used feed gases are the noble gases Xe and Ar, for example. These plasma electron floods typically sustain plasma formation through an arc discharge, which can dissipate hundreds of watts of power, thus significantly heating the arc (or plasma) chamber of the flood device. Plasma electrons, ions, and un-ionized (neutral) feed gas leave the flood. Due to the higher mobility of electrons than ions, vastly more electron current than ion current leaves the flood, so that for practical purposes the ion flux can be ignored. A portion of the electrons leaving the flood are attracted by the positive potential of a nearby ion beam, such as an ion beam generated by any one of the ion sources described above. An ion beam can carry the electrons of a plasma electron flood to a workpiece.

In practice, arc voltage (the difference in potential between the filament and arc chamber) in a plasma electron flood is kept as low as possible to limit the velocity of electrons leaving the flood and limit sputtering of the filament by plasma ions. For example, the arc voltage can be adjusted to be a little above the first ionization potential of the feed gas (e.g., 12.13 V for Xe, and 15.76 V for Ar), so that the feed gas can be efficiently ionized and thus establish an arc discharge. The energy (i.e., the velocity) of electrons leaving the flood is also maintained as low as possible, for example a few eV, to maximize the probability that electrons will be captured by the beam potential and thus transported to the workpiece. Minimizing the energy of emitted flood electrons also reduces the risk of any negative-charging damage to the devices populating the workpiece. In general, primary electrons comprising the arc can thermalize in the flood, thereby increasing the population of low-energy electrons leaving the flood.

Figure 18:
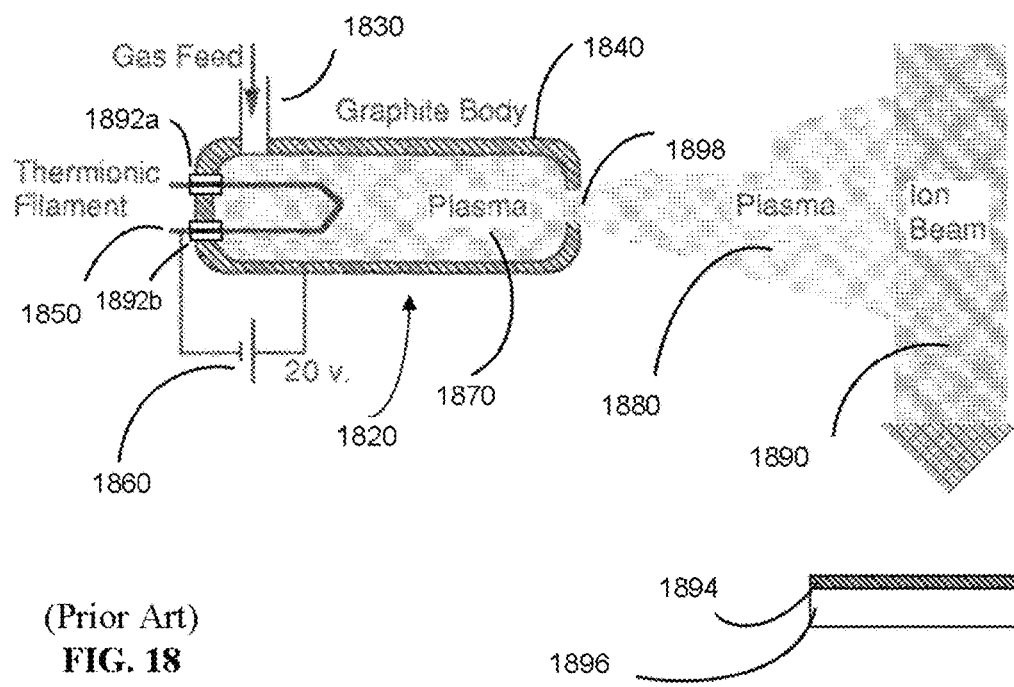
FIG. 18 shows an exemplary prior art filament-based plasma electron flood.

An exemplary prior art plasma electron flood 1820 is illustrated in FIG. 18. As shown, the electron flood 1820 is deployed proximate to an ion beam 1890 that impinges on a workpiece 1894 mounted on a platen 1896, which may be stationary or scanned relative to the ion beam 1890. The workpiece 1894 can be a silicon wafer, a SiC or GaN substrate, or another target capable of being processed by the ion beam 1890. In addition, as illustrated in FIG. 18, the plasma electron flood 1820 includes a feed gas inlet 1830, arc chamber 1840, filament 1850, arc power supply 1860, ceramic filament insulators 1892*a* and 1892*b*, and exit aperture 1898.

In operation, a filament power supply (not shown) can provide sufficient current to heat the filament 1850 to incandescence, so that the filament 1850 emits electrons thermionically. The filament 1850 can be held at a negative potential with respect to the arc chamber 1840 to provide thermionically-emitted electrons with sufficient kinetic energy to ionize the feed gas introduced by the gas inlet 1830, thereby creating a plasma 1870 in the arc chamber 1840. Primary electrons leaving the filament 1850 are mostly lost to the walls of the arc chamber 1840, and are measured as an "arc current" by the arc power supply 1860. The resulting plasma 1870 is composed of thermalized electrons and ionized feed gas. A magnetic field can be provided (not shown) within the plasma electron flood 1820 to confine the plasma 1870 and to increase plasma density. A plasma 1880, which can include electrons, ions, and un-ionized feed gas, is adapted to exit the flood 1820 via an exit aperture 1898 of the arc chamber 1840. Low-energy electrons within the plasma 1880 are attracted to the ion beam 1890 by the positive potential of the ion beam 1890, which can carry the low-energy electrons within the plasma 1880 to the workpiece 1894. The means whereby the plasma 1880 forms a bridge between the plasma electron flood 1820 and the ion beam 1890 can be called a "plasma bridge."

Typically, the filament 1850 of the electron flood 1820 is made from a refractory metal such as tungsten. The filament insulators 1892 are commonly fabricated from $Al_2O_3$ or BN. Thus, these metals (or metal-bearing compounds) are continually exposed to the flood plasma 1870, such that the filament 1850 and/or the filament insulators 1892 can undergo plasma sputtering and evaporation, and can subsequently enter the plasma 180 and propagate to the workpiece 1894.

Figure 19A:
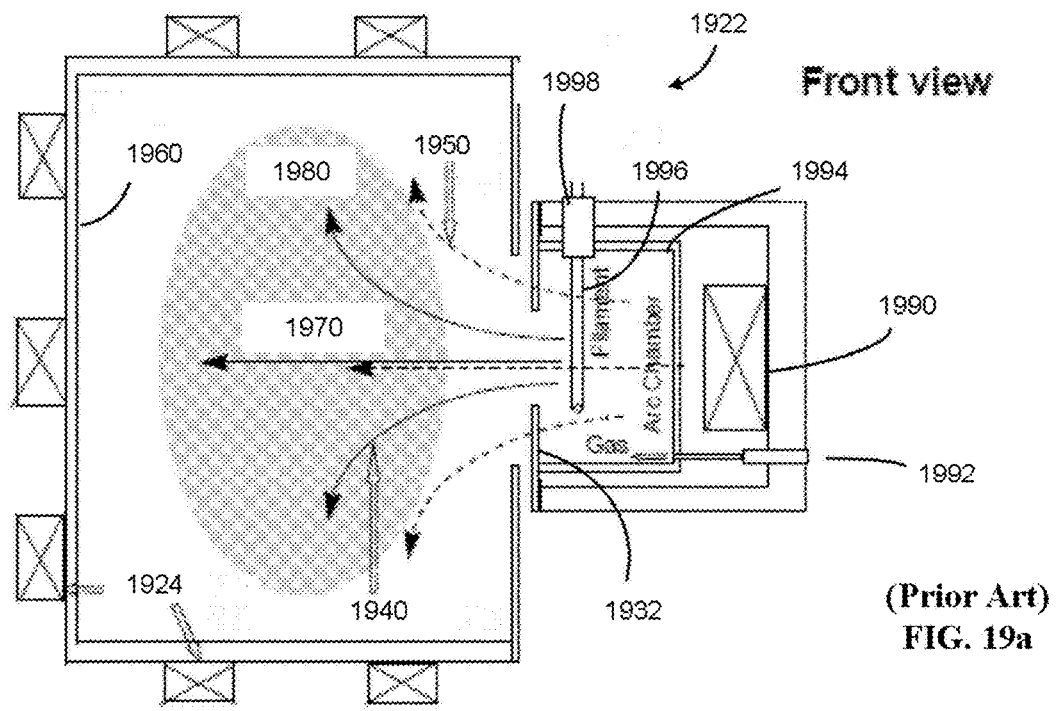
FIGS. 19a and b show another exemplary prior art filament-based plasma electron flood as seen along the beam direction and orthogonal to the beam direction, respectively.
Figure 19B:
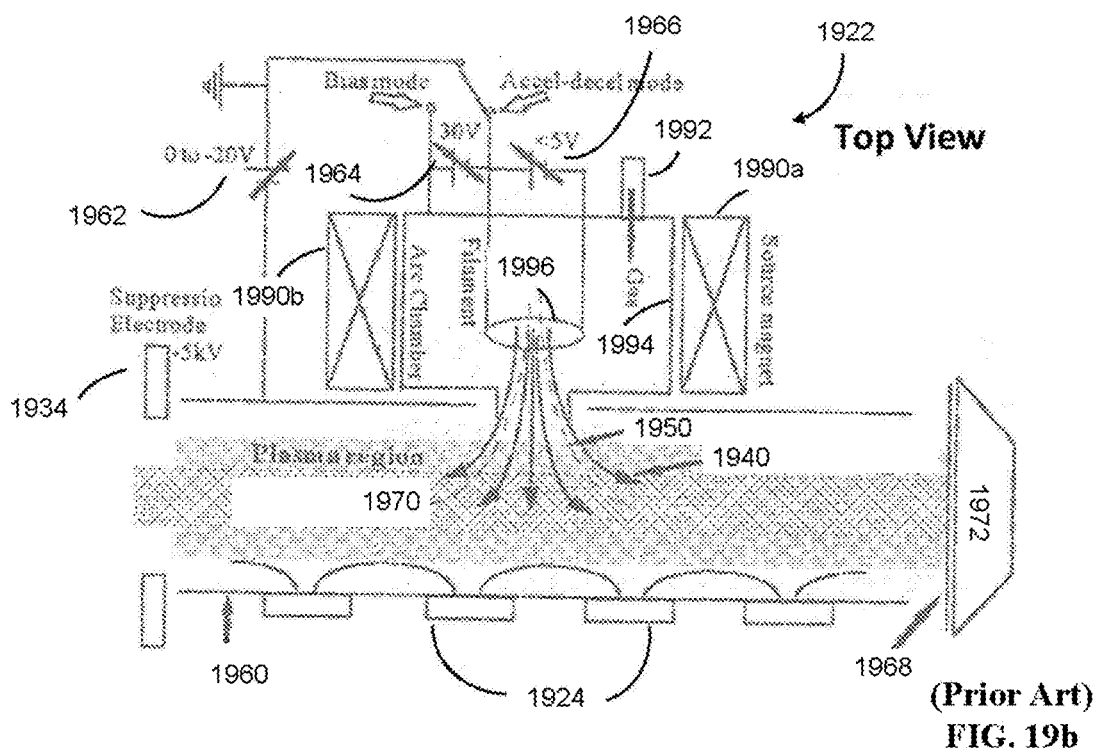

Another exemplary prior art electron flood 1922 is shown in FIGS. 19*a* and *b*. Particularly, FIG. 19*a* shows a prior art electron flood 1922 proximate to an ion beam 1970 of an elliptical shape, for example, where the electron flood 1922 is illustrated along the direction of the ion beam 1970, and the ion beam 1970 is shown propagating toward the viewer, coming out of the page. FIG. 19b shows the same plasma flood 1922 in a side view orthogonal to the direction of the ion beam 1970, where the ion beam 1970 is propagating to the right, impinging on the wafer 1968 mounted on a substrate holder or paddle 1972. FIG. 19b also shows details of multiple power supplies that can bias and supply power to various elements of the plasma flood 1922. In some embodiments, the ion beam 1970 is generated by a nearby ion source (not shown), such as one of the ion sources described above.

In operation, an inert gas, such as Ar, is fed into the arc chamber 1994 through a gas port 1992 to support a direct-current (DC) arc discharge between a filament 1996 (e.g., electrically isolated from its surroundings by an insulator 1998) and the arc chamber 1994, thereby creating a plasma (not shown), such as an Ar plasma. In FIG. 19b, dual electromagnets 1990a, 1990b generate an axial magnetic field within the arc chamber 1994, which confines the plasma within the arc chamber 1994. In FIG. 19a, a single magnet (a single electromagnet or a permanent magnet) 1990 located behind the arc chamber 1994 generates a confining field for the plasma produced within the arc chamber 1994.

The plasma 1980 leaving the arc chamber 1994 is largely composed of low-energy electrons 1940, which are captured by the positive beam potential of the ion beam 1970. Once the electrons 1940 enter the ion beam 1970, they are confined by at least one guide tube 1960 by a combination of a negative voltage on the guide tube 1960 (supplied by the power supply 1962) and an array of magnets 1924 arranged in a cusp-field configuration. The cusp fields produced by the magnets 1924 provide an intense, localized magnetic field which tends to limit electron loss to the guide tube 1960, as does the negative potential applied to the guide tube 1960 by the power supply 1962. Loss of the low-energy electrons 1940 upstream of the flood region is further limited by the addition of at least one suppression electrode 1934 (e.g., biased to about −5 kV). Thus, the electrons 1940 within ion beam 1970 are trapped in a potential well, except those near the surface of the wafer 1968. In addition, the magnetic flux lines 1950 from within the arc chamber 1994 can couple to the cusp magnets 1924 to help to guide the low-energy electrons 1940 into the guide tube 1960. If the electrons 1940 are of sufficiently low energy, the overall system depicted in FIGS. 19a and b can self-regulate the net electron flow to the wafer 1968 to eliminate positive charging without much detrimental negative charging of the wafer 1968.

The plasma flood 1922 is configured to operate in at least two different modes, a "bias" mode and an "accel-decel" mode. Shifting between the two modes is achieved by switching the point at which either the filament 1996 or the arc chamber 1994 is grounded. When the filament 1996 is grounded, the maximum energy of arc electrons cannot exceed the potential drop (e.g., about 5 eV) across the filament 1996 provided by the power supply 1966. In this "accel-decel" mode, the arc chamber 1994 is held at a positive potential by a power supply 1964 (e.g., up to about 30V). The arc electrons emitted by the filament 1996 are first accelerated toward the wall of the arc chamber 1994 and then undergo deceleration as they exit the aperture 1932. The "bias" operating mode can be achieved by grounding the arc chamber 1994 and referencing filament power supply 1966 to the negative terminal of the power supply 1964, which has its positive terminal at ground. In this "bias" mode, the maximum energy of arc electrons can be about, for example, 35 eV, which is a less desirable flood condition, but can provide a significantly higher flux of electrons 1940.

The plasma electron flood designs 1820, 1922 illustrated in FIGS. 18-20b represent common implementations in the industry. In one aspect of the present invention, these designs are modified to be substantially free of metallic components, such as by replacing the tungsten filament or cathode with a nonmetallic thermionic emitter and/or replacing ceramic insulators that are exposed to the flood plasma with insulators free of metals. In some embodiments, these materials are selected from a group of materials of the form $X_mY_n$ or C, where m and n are integers (including zero), X and Y are nonmetallic elements, and C is carbon in various forms, including diamond. Exemplary materials in this category include silicon carbide (SiC), silicon nitride ($Si_3N_4$), graphite, graphene, diamond, and vitreous carbon. In some embodiments, these materials are selected from the group of non-metallic materials described above with references to the substantially metal-free ion sources in FIGS. 14a-17.

Figure 20:
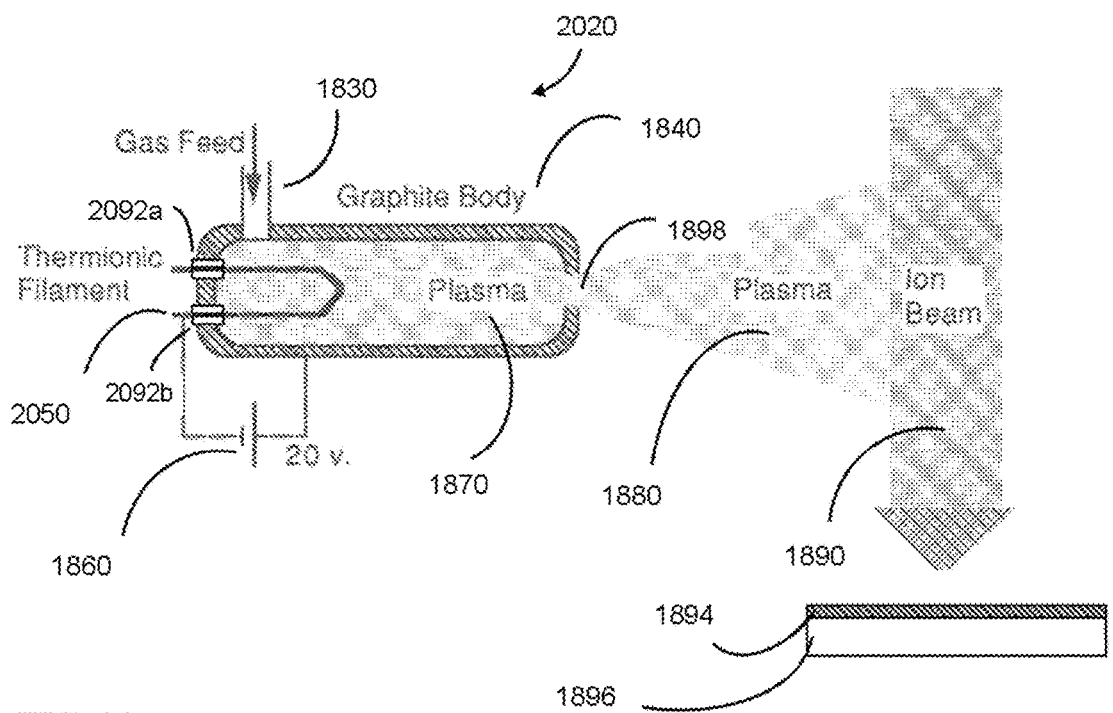
FIG. 20 shows an exemplary plasma electron flood modified from the plasma electron flood of FIG. 18.

FIG. 20 shows an exemplary plasma electron flood 2020 of the present invention modified from the plasma electron flood 1820 of FIG. 18. One or more metal-bearing components of the plasma electron flood 1820, including the thermionic filament 1850 and the ceramic insulators 1892a, 1892b, are replaced with non-metallic materials. In FIG. 20, thermionic filament 2050 of the plasma electron flood 2020, modified from the thermionic filament 1850 of FIG. 18, can be fabricated from one of graphite, vitreous carbon, graphene, diamond, or silicon carbide. Ceramic insulators 2092a, 2092b, modified from the ceramic insulators 1892a, 1892b of FIG. 18, can be fabricated of silicon nitride. All other components can remain the same as their counterparts in FIG. 18.

Figure 21:
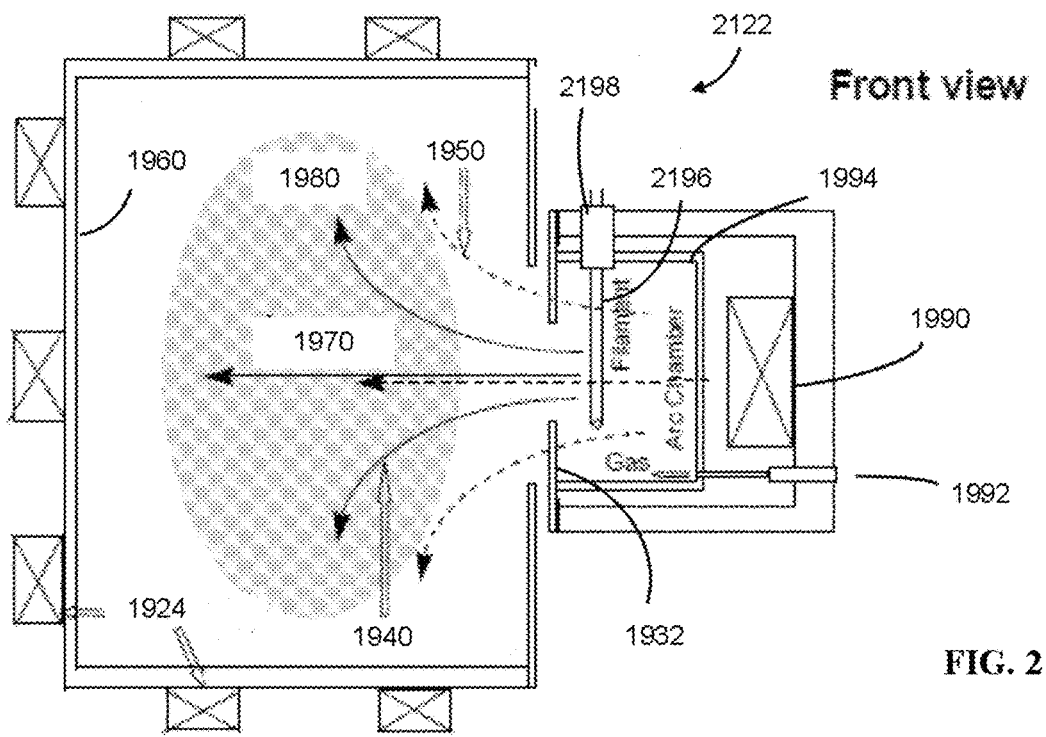
FIG. 21 shows an exemplary plasma electron flood modified from the plasma electron flood of FIGS. 19a and b.

FIG. 21 shows an exemplary plasma electron flood 2122 modified from the plasma electron flood 1922 of FIGS. 19a and b. One or more metal-bearing components of the plasma electron flood 1922, including the filament 1996 and ceramic insulators 1990, are replaced with non-metallic materials. In FIG. 21, thermionic filament 2196 of the plasma electron flood 2122, modified from the thermionic filament 1996 of FIGS. 19a and b, can be fabricated from one of graphite, vitreous carbon, graphene, diamond, or silicon carbide. Ceramic insulator 2198, modified from the ceramic insulator 1998 of FIGS. 19a and b, can be fabricated of silicon nitride. All other components can remain the same as their counterparts in FIGS. 19 a and b.

The plasma electron floods of the present invention, as depicted in FIGS. 20 and 21, have little or no metal-bearing compounds in direct contact with the flood plasma in the arc chamber, and therefore produce little or no metal contamination that can propagate to the workpiece. To accomplish this, the plasma electron floods 1820 of FIG. 18 and/or the plasma electron flood 1922 of FIGS. 19a and b can be modified by fabricating those structures that are exposed to source plasma using non-metal bearing materials described above.

In some embodiments, the thermionic filament 1850 of the plasma electron flood 1820 of FIG. 18 and/or the thermionic filament 1996 of the ion source 1922 of FIGS. 19a and b, which are traditionally made of tungsten, can be replaced with a resistively-heated graphite filament. For example, the filament 2050 of the ion source 2020 of FIG. 20 and/or the filament 2196 of the ion source 2122 can be resistively-heated, non-metallic filaments.

In general, the present invention features a plasma electron flood (i.e., a type of plasma generator) that includes an ionization chamber, one or more gas inlets for introducing a feed gas, one or more thermionic emitters, and an extraction aperture through which plasma can be extracted from the plasma electron flood. In some embodiments, the plasma electron flood is constructed such that substantially all surfaces of the plasma electron flood that are in contact with the plasma are fabricated of materials containing substantially no metals. The materials used to fabricate parts that have surfaces in direct contact with the plasma are selected from a group of materials of the form $X_mY_n$ or C, where m and n are integers (including zero), X and Y are nonmetallic elements, and C is carbon in various forms, including diamond. In some embodiments, X and Y are selected from the materials Si, N, and C. In some embodiments, these materials are selected from the group of non-metallic materials described above with references to the substantially metal-free ion sources in FIGS. 14*a*-17.

Exemplary fabrication materials include silicon carbide (SiC), silicon nitride ($Si_3N_4$), graphite, graphene, diamond, and vitreous carbon. These materials are all refractory and non-contaminating since they do not contain metal contaminants. Specifically, their maximum service temperature is above the operating temperature of the plasma electron flood parts that are fabricated from these materials. SiC and C are appropriate materials for thermionic emitters such as IHC's and/or filaments. These refractory materials are also appropriate for fabricating ionization chamber liners, repellers and/or plasma electrodes. $Si_3N_4$ is suitable as a replacement for alumina ($Al_2O_3$) if exposed insulators are required, for example as replacement for insulators 1892, 1998 in the plasma electron floods 1820, 1922 of FIG. 18-19*b*, respectively. $Si_3N_4$ is also an appropriate ionization chamber liner material because such liners need not be electrically conductive. In general, due to the use of electron flood components fabricated from non-metallic materials, little or no flood-generated metals can propagate to a wafer, thereby significantly reducing yield loss.

In some embodiments, a plasma electron flood of the present invention has substantially the same design as an ion source. Hence, a single plasma generator can function as an ion source for producing ion beams and a plasma electron flood for producing electron flux. When the dual-function plasma generator is operated as an ion source, a process gas is ionized in the plasma chamber to form a plasma therein. The plasma can be defined as an ionized gas in which there are an approximately equal number of positive and negative charges, so that the plasma is substantially electrically neutral. Exemplary process gases used can include $AsH_3$, $PH_3$, $BF_3$, $SiF_4$, $N_2$, $GeF_4$, $CO_2$, CO, $CH_3$, $SbF_5$, and/or $CH_6$. By biasing the plasma generator to a positive voltage with respect to a workpiece, ions can be extracted from the plasma generator and transported to the workpiece for applications such as doping or material modification. When the plasma generator is operated as a plasma electron flood, a different process gas (e.g., an inert gas such as Ar, Xe, or Kr) can be ionized in the plasma chamber to form a plasma. By biasing the plasma generator to a negative voltage with respect to the workpiece, electrons can be extracted from the plasma generator and transported to the workpiece for charge control. Therefore, any one of the ion sources and plasma electron floods described above can be operated as a generic plasma generator for producing either extracted ion beams or electron flux. Such a dual-function plasma generator can include one or more components fabricated from material(s) that do not contain metals. These components can be fabricated from the same or different non-metal containing materials. Such a dual-functional design, however, is not typically implemented in commercial implanters.

In alternative embodiments, a plasma electron flood has a different design than an ion source. For example, any one of the ion sources describes above with respect to FIGS. 14*a*-17 can be used to generate an ion beam that is substantially metal free, while any one of the plasma electron floods of FIGS. 19*a*-21 can be used to generate an electron flux that is substantially metal free. Because the risk of metal contamination to a workpiece is higher in the case of a plasma electron flood than in the case of an ion source due to the closer proximity of a plasma electron flood to the workpiece, the use of mostly or solely nonmetallic components that contact a plasma may be more critical in plasma electron flood designs than in ion source designs. In some cases, ion sources can be designed to permit an acceptable, minimal level of metal contamination of the workpiece by, for example, limiting the use of nonmetallic components contacting the plasma.

In some embodiments, the ion sources 1401, 1500 described above with reference to FIGS. 14*a*-15 can operate as plasma electron floods when these plasma generators are biased negatively or at the same potential (e.g., at ground potential) in relation to a workpiece. These plasma generators can operate as ion sources if they are biased positively with respect to the workpiece. In some embodiments, the plasma electrode aperture 1430 common to both the ion sources 1401 and 1500 can be configured differently in the case of a plasma electron flood than in the case of an ion source. For example, the plasma electrode aperture 1430 can be smaller for a plasma electron flood than for an ion source. This is due to the much higher mobility of electrons than ions, such that a much higher electron current can be extracted from a plasma electrode aperture area than an ion current.

Figure 22:
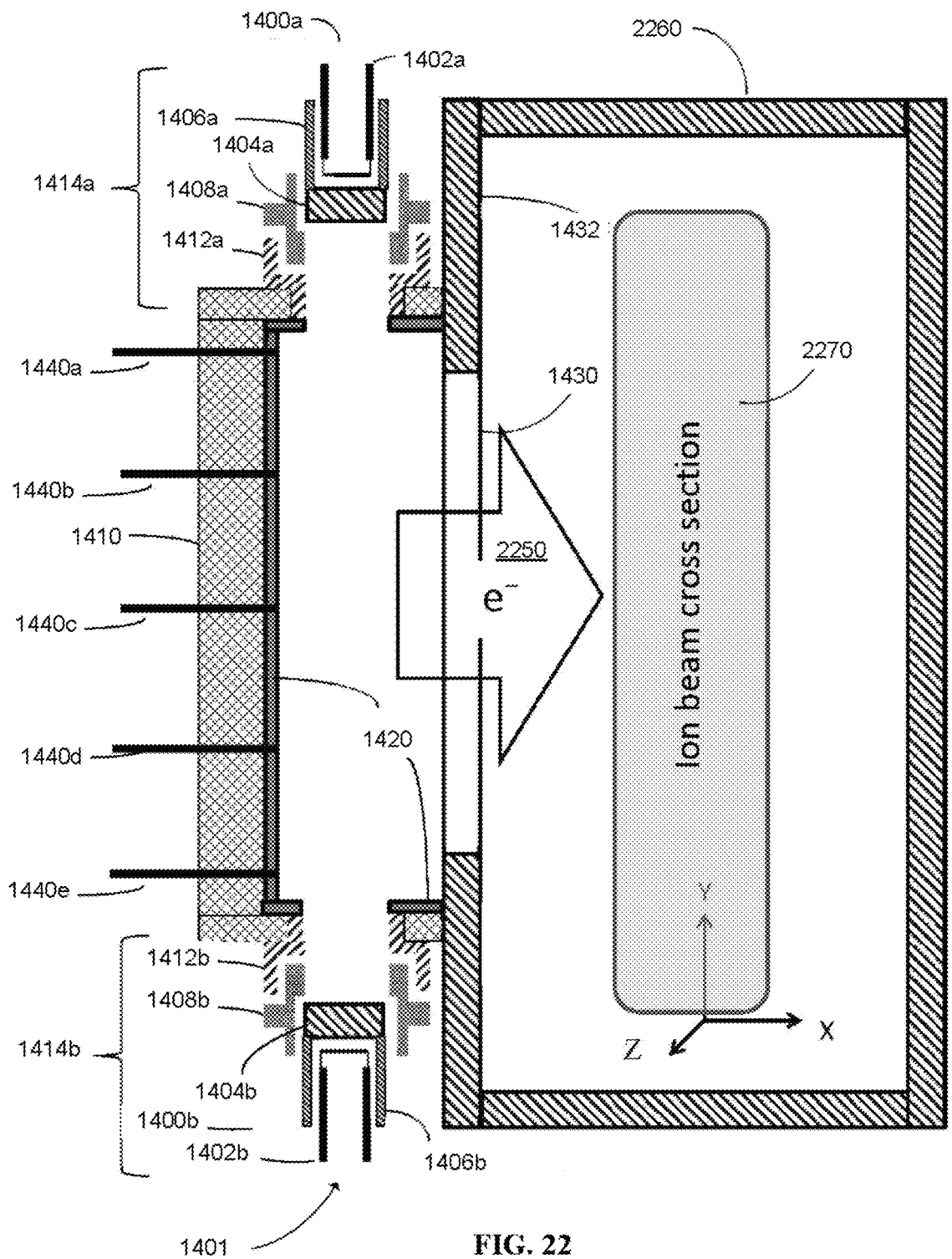
FIG. 22 shows the ion source of FIGS. 14a and b operated as a plasma electron flood.

In some embodiments, the plasma generator 1401 of FIGS. 14*a* and *b* is operated as either an ion source or a plasma electron flood. FIG. 22 shows the plasma generator 1401 operated as a plasma electron flood, where the plasma generator 1401 is deployed in the beam line of an ion implanter relative to an ion beam 2270 generated by a separate ion source (not shown). As shown, the ion beam 2270 forms an elongated, ribbon-type shape, propagating in the Z direction. The plasma electrode 1432 of the plasma generator 1401 can be coupled to a conductive rectangular frame 2260 that surrounds the ion beam 2270. The plasma generator 1401 can be operated such that an electron flux 2250 is extracted therefrom via the plasma electrode aperture 1430. The resulting electron flux 2250 can be drawn into the ion beam 2270 by its positive beam potential, trapped by the ion beam 2270, and transported to a workpiece (not shown).

Figure 23:
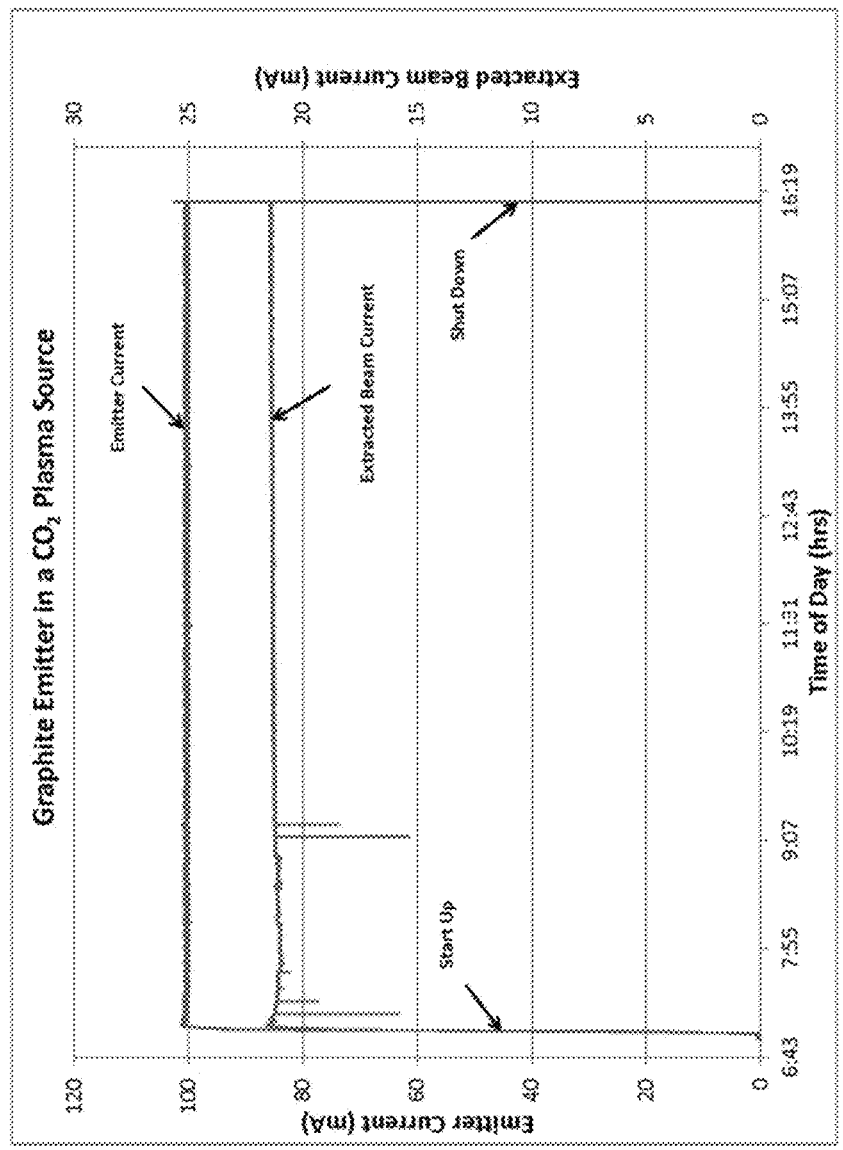
FIG. 23 shows exemplary graphite emitter current and extracted beam current for an exemplary ion source configuration modified from the ion source of FIGS. 14a and b.

In addition, the plasma generator 1401 of FIGS. 14*a* and *b* can be modified and operated as an ion source that produces minimal or no metal contaminants in the extract ion beam. To operate the plasma generator 1401 as an ion source, a positive voltage (e.g., 40 kV) can be applied and a plasma (e.g., a $CO_2$ plasma) can be generated in the ionization chamber 1410. Positive ions can be extracted and formed into an ion beam. In an exemplary configuration, a graphite electron emitter in an indirectly-heated cathode configuration is inserted into the plasma generator 1401. Specifically, one IHC assembly 1400*b* incorporates a graphite emitter button 1404*b* and a graphite tubular emitter holder 1406*b*, while the second IHC assembly 1400*a* incorporates a tungsten emitter button 1404*a* and a tungsten tubular emitter holder 1406*a*. That is, corresponding components of the IHC assemblies 1400*a* and *b* are constructed from different materials. The control system 400 of FIG. 4 can be used to produce about 100 mA of emitter current for each of the emitters 1404*a* or *b* during plasma generation. About 22 mA of ion beam is extracted from the resulting ion source. FIG. 23 shows exemplary graphite emitter current and extracted beam current over a nine-hour period for such an ion source configuration.

Figure 24:
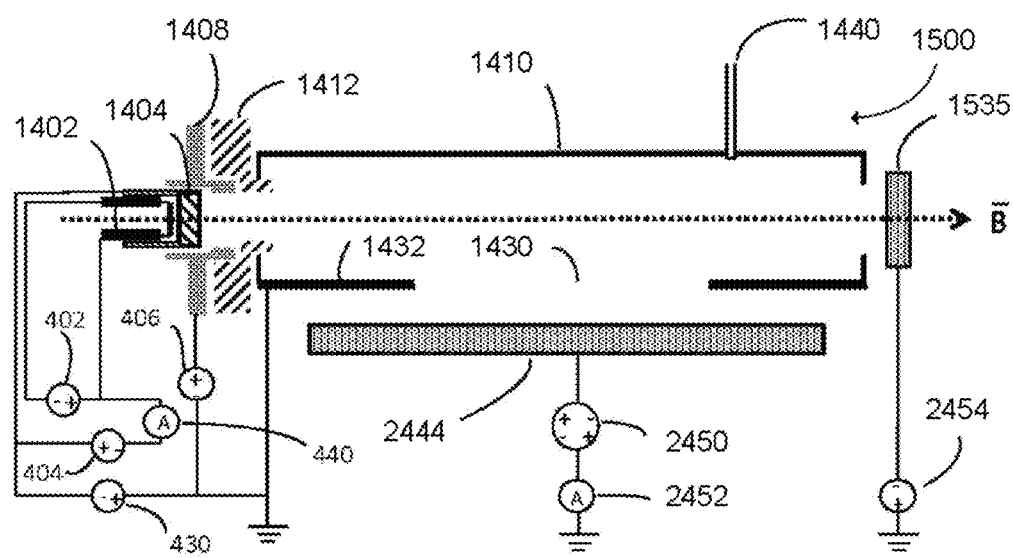
FIG. 24 shows an exemplary control circuit used to operate the plasma generator of FIG. 15 as a plasma electron flood.

In some embodiments, the plasma generator 1500 of FIG. 15 is operated as either an ion source or a plasma electron flood. FIG. 24 shows an exemplary control circuit used to operate the plasma generator 1500 of FIG. 15 as a plasma electron flood. As shown, a filament power supply, which can be the same as the filament power supply 402 of FIG. 4, provides a current to the filament 1402 of the plasma generator 1500. The filament power supply 402 is referenced to the negative output terminal of the cathode power supply, which can be the same as the cathode power supply 404 of FIG. 4, whose positive terminal is referenced to the emitter 1404. Thus, electrons emitted from the filament 1402 are accelerated to the emitter 1404 with a kinetic energy of $K=eV_c$, where $V_c$ is the output voltage of the cathode power supply 404. In addition, the electron beam heating power P delivered to the emitter 1404 is given by $P=V_c I_e$, where $I_e$ is the filament emission current. The filament emission current $I_e$ can be directly measured by a current meter, same as the current current meter 440 of FIG. 4, which monitors the current leaving the filament 1404 and provided by the cathode power supply 404. The output of the current meter 440 is fed into a PID controller (not shown), which can adjust the voltage output of the filament power supply 402 to maintain an emission current set point value, and thus a constant electron beam heating power. The emitter 1404 is thus heated to incandescence, thereby thermionically emitting electrons that are confined by axial magnetic field B directed along the axis of the ionization chamber 1410 and directed into the ionization chamber 1410. An emitter power supply, which can be the same as the emitter power supply 430 of FIG. 4, biases the emitter 1404 negatively with respect to the ionization chamber 1410, so that electrons entering the ionization chamber 1410 have a kinetic energy given by $K=eV_e$, where $V_e$ is the output of the emitter power supply 430. The anode 1408 is biased to a positive potential with respect to the ionization chamber 1410 by an anode power supply, which can be the same as the anode power 406 of FIG. 4. A noble gas, such as argon (Ar) or xenon (Xe), is fed into the ionization chamber 1410 by the gas feed 1440. This feed gas is ionized by the energetic electrons entering the ionization chamber 1410, thereby forming a plasma. The repeller electrode 1535 is held at a negative potential with respect to the ionization chamber 1410 by a repeller power supply 2454. The negative potential increases the path length of the magnetically confined electrons by reflecting the electrons in a reflex geometry. Thus, a plasma column is sustained along the length of the ionization chamber 1410. Plasma can exit the plasma electron flood 1500 through the plasma electrode aperture 1430. Low-energy plasma electrons in the plasma can then be trapped by an ion beam nearby (not shown) and transported to the workpiece (not shown).

Below is a set of exemplary voltage and current ranges for some of the power supplies of FIG. 24:

Filament power supply 402: 0 to 10V, 0 to 60 A (under closed-loop control)
Cathode power supply 404: 500V to 1000V, 0 to 2 A
Anode power supply 406: 0 to 200V, 0 to 4 A
Emitter power supply 430: 15V to 150V, 0 to 4 A FIG. 24 also shows an exemplary circuit configuration for measuring the output of the plasma electron flood 1500. The plasma electron flood 1500 can be installed in a vacuum chamber (not shown) and energized. About 2 standard cubic centimeters per minute (sccm) of Ar gas is supplied to the ionization chamber 1410 via the gas feed 1440. The ionization chamber 1410 and the plasma electrode 1432 are held at ground potential, and a conductive collector plate 2444 is placed a few centimeters in front of the plasma electrode aperture 1430. A bipolar power supply 2450 is configured to apply an electric potential to the collector plate 2444. In operation, the current that sinks to the collector plate 2444 is monitored by a current meter 2452 that is referenced to earth ground. By applying a bias voltage to the collector plate 2444 from about −15V to +25V, the plasma current leaving the plasma electron flood 1500 via the aperture 1430 can be measured.

Figure 25:
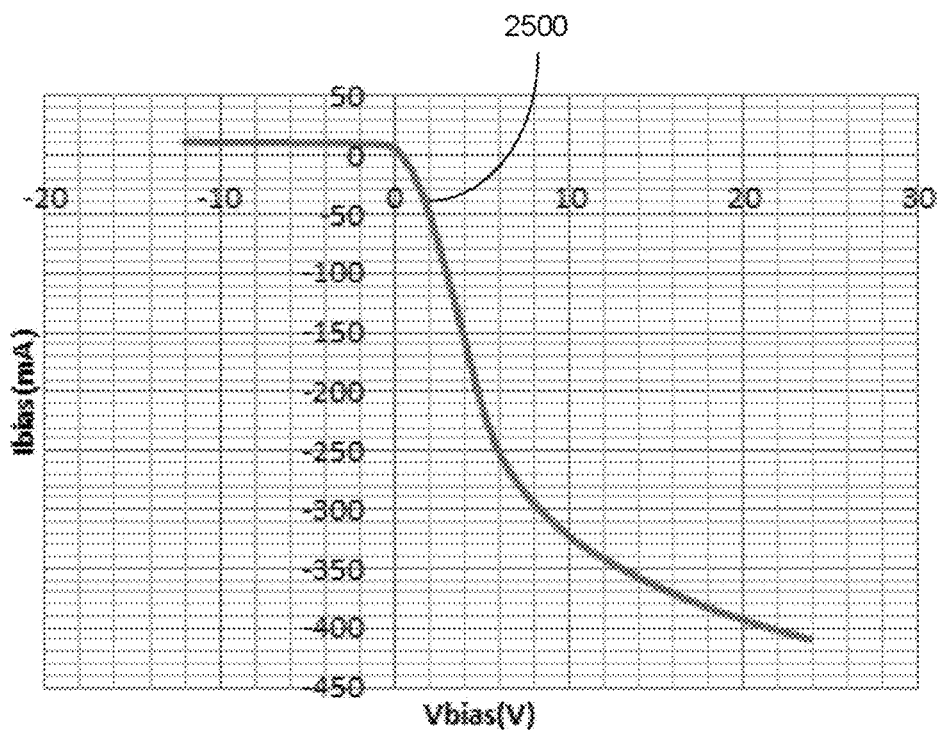
FIG. 25 shows electron emission data determined by the control circuit of FIG. 24 for the plasma electron flood of FIG. 15.

FIG. 25 show exemplary electron emission data determined by the control circuit of FIG. 24 for an electron flux extracted from the plasma electron flood 1500. Specifically, FIG. 25 shows the voltage output of the bipolar power supply 2450 on the abscissa and the collector plate current measured by the current meter 2452 on the ordinate. In general, ion current is positive, and electron current is negative. Due to the much higher mobility of electrons relative to the Ar$^+$ ions, the resulting measured ion current is more than two orders of magnitude smaller than the measured electron current, as seen in the ion saturation current 2500 in the negative value region of the abscissa in FIG. 25.

In some embodiments, an electron flood is configured for operation in an ion implantation system, such that the majority of electrons emitted from the electron flood have low energy, e.g., ≤2 eV, so that they can be effectively captured by the nearby ion beam potential and transported to the workpiece without producing significant negative charging of the workpiece. Plasma electron floods are thus characterized in terms of the "electron temperature" of the electrons they produce. A technique is provided to determine the electron temperature of electrons generated by a plasma electron flood and ensure that the electron temperature is sufficiently low for ion implantation purposes. In the case of Langmuir probe measurements, the probe electron current $I_e$ is given by:

$$I_e(V_B) = -I_{es}\exp[-e(V_P-V_B)/kT_e], \quad V_B \leq V_P, \qquad \text{Eq. (1)}$$

$$I_e(V_B) = -I_{es}, \quad V_B >> V_P, \text{ and} \qquad \text{Eq. (2)}$$

$$I_i(V_B) = I_{is}, \quad V_B << V_P, \qquad \text{Eq. (3)}$$

where e is the electronic charge, k is Boltzmann's constant, $V_B$ is the probe bias voltage, $V_P$ is the plasma potential, $I_{es}$ is the electron saturation current, $T_e$ is the electron temperature, and $I_{is}$ is the ion saturation current. For $V_B>>V_P$, the probe collects electron saturation current $I_{es}$. For $V_B<<V_P$, the probe collects ion saturation current $I_{is}$. For $V_B<V_P$, the electrons are partially repelled by the probe, and for a Maxwellian electron velocity distribution, the electron current decreases exponentially with decreasing V. This can be seen by taking the natural logarithm of Eq. (1) to produce Eq. (4):

$$\ln I_e = (e/kT_e)(V_B-V_P) + \ln I_{es}. \qquad \text{Eq. (4)}$$

Eq. (4) has the form of a straight line with a slope of $1/kT_e$, with $kT_e$ expressed in units of eV (electron-volts), when probe current is plotted against probe voltage referenced to the plasma potential $V_P$.

Figure 26A:
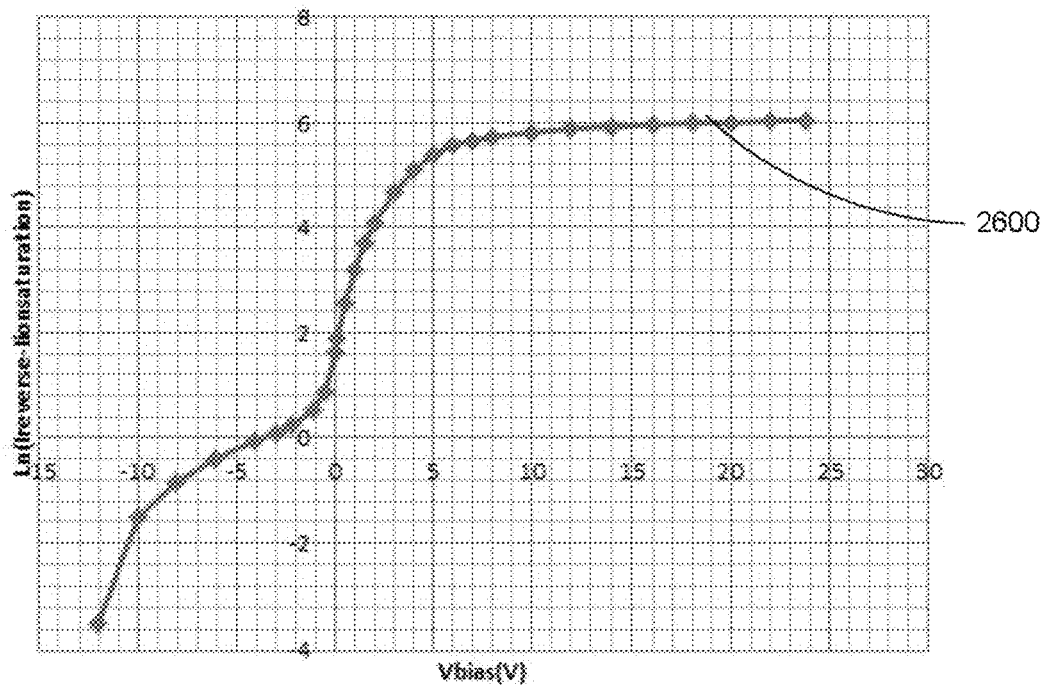
FIGS. 26a and b show exemplary electron emission data generated by the control circuit of FIG. 24 and used to determine the electron temperature of the electron flood of FIG. 15.
Figure 26B:
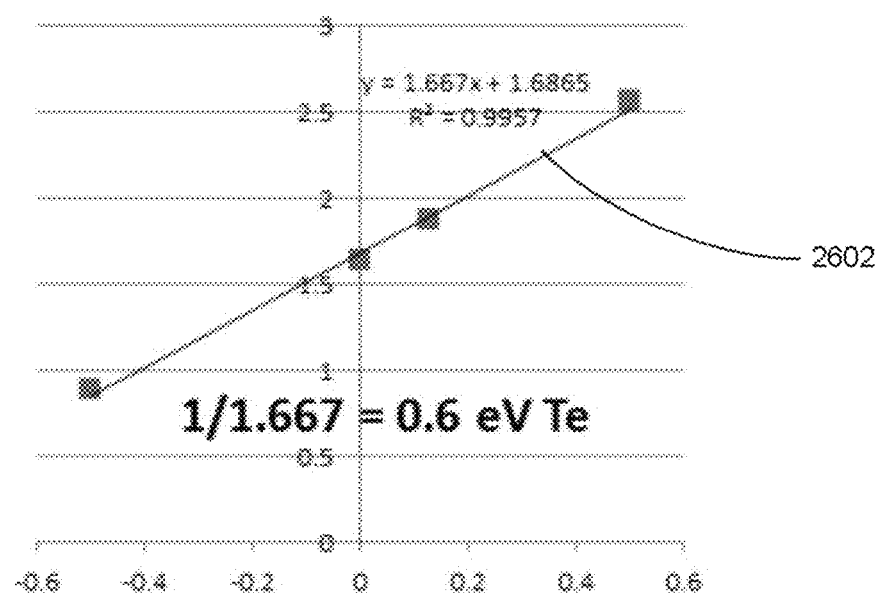

FIGS. 26*a* and *b* show exemplary data generated by the control circuit of FIG. 24 and used, in conjunction with the technique described above, to determine the electron temperature $kT_e$ of the electron flood 1500. Specifically, the electron emission data of FIG. 25 is redrawn in FIG. 26*a*, where the natural logarithm of collector plate current minus ion saturation current is plotted against collector plate voltage $V_B$ (while the abscissa is not corrected for the plasma potential $V_P$). The section of the curve 2600 of FIG. 26*a* from $-0.5V \leq V_B \leq 0.5V$ is redrawn in detail in FIG. 26*b*. The slope of a line 2602 fitted to the curve 2600 of FIG. 29*b* yields a value of $kT_e \approx 0.6$ eV. This low electron temperature value demonstrates that the plasma electron flood 1500 as described above with reference to FIG. 24 yields a population of low-energy electrons appropriate for use in charge neutralization of an ion implanter.

In addition, the plasma generator 1500 of FIG. 15 can be modified and operated as an ion source that produces minimal or no metal contaminants in the extract ion beam. To operate the plasma generator 1500 as an ion source, the emitter 1404 can be constructed from graphite, a positive voltage (e.g., 40 kV) can be applied to the plasma generator 1500, and an Argon (Ar) ion beam can be extracted from the aperture 1430.

Figure 27:
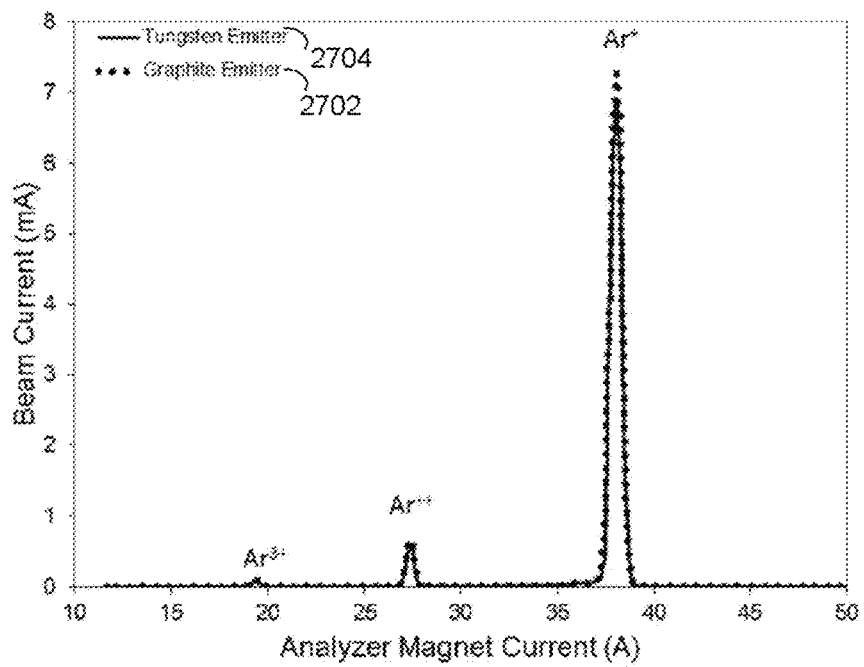
FIG. 27 shows two Argon spectra generated using emitters of different materials in the plasma generator of FIG. 15 operated as an ion source.

FIG. 27 shows Argon spectra generated using emitters of different materials in the plasma generator 1500 of FIG. 15, where the plasma generator 1500 is operated as an ion source. Specifically, FIG. 27 shows an Ar atomic mass unit (amu) spectrum generated using a graphite emitter 1404 in the plasma generator 1500, as represented by the dotted line 2702, overlaid on the Ar amu spectrum generated using an emitter 1404 made of tungsten, as represented by the solid line 2704. The two spectra appear to be nearly identical. FIG. 27 demonstrates that a plasma generator having at least one graphite emitter performs as well as a conventional plasma generator with a tungsten emitter. As shown, the plasma generator with at least one graphite emitter can generate an ion beam having as many Ar ions as a conventional plasma generator even when the material of its emitter is replaced with a material containing little or no metal (e.g., graphite).

Figure 28:
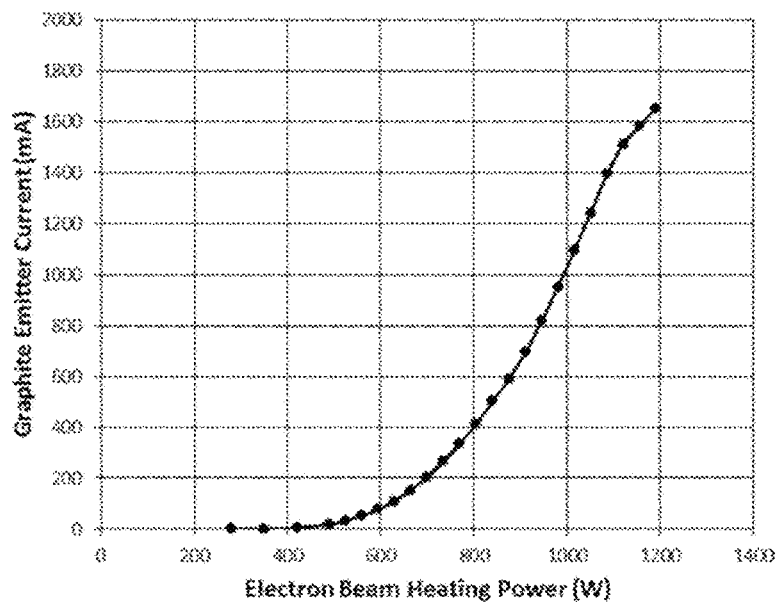
FIG. 28 shows thermionic emission current as a function of electron beam heating power for another exemplary plasma electron flood of the present invention.

FIG. 28 shows thermionic emission current as a function of electron beam heating power for another exemplary plasma electron flood of the present invention. The plasma electron flood is constructed using a graphite electron emitter in an indirectly-heated cathode configuration, such as the configurations described above with respect to FIGS. 14*a* and *b*, FIG. 15, and FIG. 22. As shown, these configurations all include at least one substantially the same indirectly-heated cathode (IHC) assembly 1400, which includes the emitter 1404, tubular emitter holder 1406, and thermionic filament 1402. The plasma electron flood used to generated the data of FIG. 28 includes a similar IHC assembly, with the emitter (similar in configuration to the emitter 1404) made of graphite. The IHC assembly also includes a relatively thick, circular disk that mounts onto a graphite tubular emitter holder (similar in configuration to the emitter holder 1406). The IHC assembly further includes a filament (similar in configuration to the filament 1402) constructed from tungsten and tantalum, but is shielded from the ionization chamber plasma by the tubular emitter holder. FIG. 28 shows the emitter current of the resulting device as a function of electron beam heating power. As shown, the device is capable of producing more than 1.6 A of emitter current at 1.2 kW of electron beam heating power, which is defined as the product of filament emission and the voltage applied between the filament and the emitter (similar in arrangement to the filament 1402 and emitter 1404 of the IHC assembly 1400).

Figure 29:
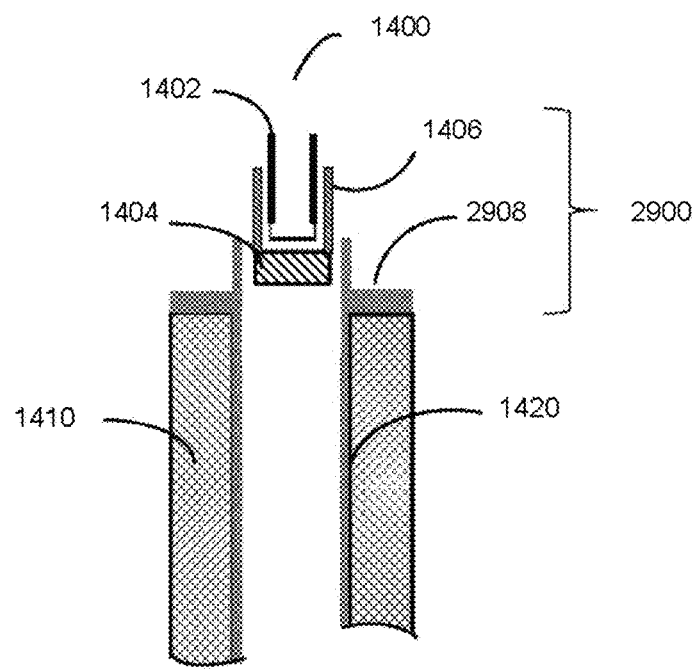
FIG. 29 shows an exemplary electron gun modified from the electron guns of FIGS. 14a-b and FIG. 15.

In another aspect, certain components of one or more plasma generators of the present invention can be redesigned to simply construction and further reduce metal contamination. FIG. 29 shows an exemplary electron gun 2900 modified from the electron gun 1400 of the plasma generator 1401 of FIGS. 14*a* and *b* or the electron gun 1400 of the plasma generator 1500 of FIG. 15 to simplify electron gun design and reduce metal contamination. This electron gun 2900 can also be implemented in the plasma electron flood configuration of FIG. 22, in place of the electron gun 1400*a* and/or 1400*b*. As shown, the electron gun 2900 does not include a positively-biased anode. Specifically, the anode 1408 and ground element 1412 of the electron gun 1400 are combined into a single structure 2908. All other components of the electron gun 2300 can be substantially the same as their counterpart components of the electron guns 1400 of the plasma generator 1401 or 1500. This simplified design reduces the structural complexity and size of the component. The combined element 2908, as well as the liner 1420, can be made from one or more materials with little or no metal (e.g., graphite).

Figure 30:
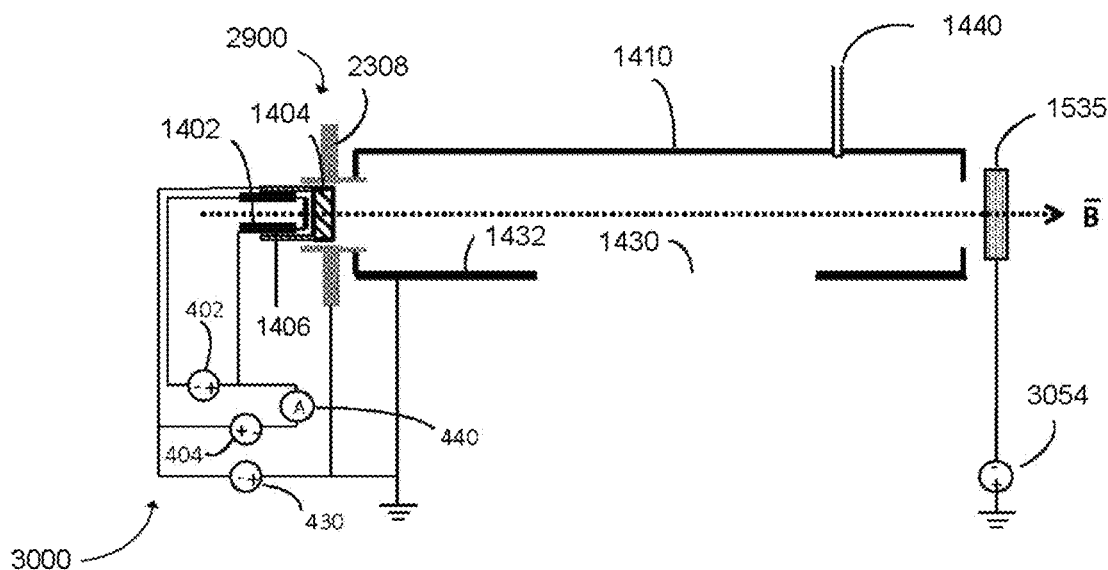
FIG. 30 shows an exemplary control system for operating the electron gun of FIG. 29 within the plasma generator of FIG. 15.

FIG. 30 shows an exemplary control system 3000 for controlling the operation of the electron gun 2900 of FIG. 29. As shown, the electron gun 2900 is implemented in the plasma generator 1500, which includes the repeller 1535 describes above with reference to FIG. 15, while replacing the electron gun 1400 of the plasma generator 1500. In other embodiments, the electron gun 2900 can replace the electron guns 1400 of the plasma generator 1401 of FIGS. 14*a* and *b* and/or FIG. 22. In comparison to the control system 400 of FIG. 4 that is configured to operate the electron gun 104 of FIG. 1, the control system 3000 eliminates the need for the anode power supply 406, as anode is eliminated in the gun design 2900. Most other control components of the control system 3000 can be substantially the same as their counterparts in the control system 400. For example, the control circuit 3000 includes (i) the filament power supply 402 for providing a voltage across the filament 1402 to regulate filament emission, (ii) the cathode power supply 404 for biasing the filament 1402 with respect to the cathode 1406, (iii) the emitter power supply 430 for biasing the emitter 1404 with respect to the ionization chamber 1410, and (iv) the current meter 440 that monitors the current leaving the filament 1402. The control circuit 3000 can additionally include a repeller power supply 3054 that is configured to hold the repeller electrode 1535 at a negative potential with respect to the ionization chamber 1410.

In some embodiments, the ion source 1600 of FIG. 16 can be operated as a plasma electron flood. In addition, some or all surfaces of the plasma electron flood 1600 that come in contact with the plasma can be constructed from non-metallic materials as described above. As shown in FIG. 16, the plasma electron flood 1600 includes the arc chamber 1002, feed gas inlet 1004, nonmetallic filament 1606, nonmetallic ceramic insulators 1608, nonmetallic repeller electrode 1610, nonmetallic aperture plate 1612, plasma electrode aperture 1614, and magnet coils 1016. The pair of magnet coils 1016 can produce a magnetic field along an axis joining the two coils. This magnetic field serves to confine electrons E that are thermionically emitted from the heated filament 1606 to the helical path 1020. The filament 1606 can be held at a negative potential with respect to the arc chamber 1002 to provide the electrons 1018 with sufficient kinetic energy to ionize the feed gas introduced by the gas inlet 1004. The path length of the electrons 1018 can be increased by either applying a similar negative voltage to repeller electrode 1610 to repel the electrons, or repeller electrode 1610 can be self-biasing, i.e., insulated from electric potential. The electrons 1018 are adapted to impinge on the walls of the arc chamber 1002 along the electron path 1020 and are lost. The current associated with this electron loss is measured as an "arc current." Such design of the plasma electron flood 1600 is called a "reflex geometry," since the thermionically-emitted electrons can travel back and forth between the filament 1606 and the repeller electrode 1610 before being lost. The back-and-forth action can create a dense plasma comprising thermalized electrons and ionized feed gas. In general, by constructing one or more components of the plasma electron flood 1600 from non-metallic materials, the plasma electron flood 1600 can be configured to minimize metal contamination in a workpiece.

In some embodiments, the ion source 1700 of FIG. 17 can be operated as a plasma electron flood. In addition, some or all surfaces of the plasma electron flood 1700 that come in contact with the plasma can be constructed from non-metallic materials as described above. For example, the emitter (cathode) 1706 can be fabricated from a material with little or no metal, such as graphite. The altered structure is configured to minimize metal contamination in a workpiece. The circuit for operating the resulting plasma electron flood 1700 can be similar to the control circuit 3000 for operating the plasma electron flood of FIG. 30. For example, with reference to FIG. 17, the power supply 1112 can bias the indirectly-heated cathode assembly that comprises the emitter 1706. The power supply 1108 can power the filament 1104. The filament 1104 is floated relative to the emitter 1706 by the power supply 1110 to provide an accelerating field for thermionic electrons emitted from the filament 1104. This heats the emitter 1706 to incandescence, thereby producing primary electrons to create the plasma 1120 of the gas species that are introduced into the ionization chamber 1114 by the gas cylinder 1118. The magnetic field B confines the primary electrons to a helical trajectory, where they are reflected by the repeller 1716 in a reflex geometry. The repeller 1716 is self-biasing. That is, the repeller 1716 is electrically isolated and can naturally come to a potential near the energy of the primary electrons during operation. The plasma electron flood 1700 can also include non-metallic ionization chamber liners 1720 and/or a non-metallic plasma aperture 1730.

In another aspect, each of the ion sources 100, 601 and 900 described above with reference to FIGS. 1-9 can be operated as a plasma electron flood. In addition, each structure can be modified such that it produces little or no metal contaminants in the extracted ion beam (if operated as an ion source) or electron flux (if operated as an electron flood). In some embodiments, with respect to the plasma generator 100, an interior surface of the ionization chamber 102, which is exposed to the primary plasma (not shown) and/or the secondary plasma 310, can be constructed from a non-metallic material selected from one or more of the classes of non-metallic materials described above. For example, liners constructed from a non-metallic material can be used to substantially cover the interior surface of the ionization chamber 102. As a result, the ion beam (composed mostly of ions) or electron flux (composed mostly of electrons) extracted from the exit aperture 198 comprises substantially no metal. In some embodiments, the thermionic emitter/cathode 302 of each electron gun 104 includes at least one surface exposed to the primary plasma or the secondary plasma 310. In such an instance, the thermionic emitter/cathode 302 can be constructed from a non-metallic material that is the same as or different from the non-metallic material used for the ionization chamber 102 (e.g., as liners of the ionization chamber 102). Exemplary non-metallic materials include silicon carbide (SiC), silicon nitride ($Si_3N_4$), graphite, diamond, graphene, and vitreous carbon. Alternatively, the thermionic emitter/cathode 302 can be constructed from a refractory metal selected from the class of refractory metals described above. The control circuit 400 can be used to control the plasma generator 100 to turn on/off the secondary plasma 310 in each of the electron gun 104 and/or operate the plasma generator 100 as an ion source or electron flood, for example.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A plasma generator for an ion implanter, the plasma generator comprising:
   at least one electron gun including:
      an electron source for generating a beam of electrons; and
      a plasma region for generating a secondary plasma by electron impact using at least an anode and a ground element, the secondary plasma being sustained by at least a portion of the beam of electrons; and
   an ionization chamber comprising:
      two ends disposed along a longitudinal axis, one of the two ends comprising an aperture coupled to an outlet of the electron gun and configured to receive from the electron gun at least a portion of the beam of electrons, wherein the ionization chamber is adapted to generate a primary plasma based on the at least a portion of the beam of electrons received from the electron gun; and
      an interior surface of the ionization chamber being exposed to the primary plasma and constructed from a non-metallic material,
   wherein the at least one electron gun, including the at least one anode and the ground element, is positioned external to the ionization chamber and configured to introduce the at least a portion of the beam of electrons to the ionization chamber in a direction along the longitudinal axis of the ionization chamber.

2. The plasma generator of claim 1, wherein the primary plasma is adapted to generate a plurality of ions and a plurality of electrons.

3. The plasma generator of claim 1, further comprising an exit aperture for extracting at least one of the plurality of ions or the plurality of electrons from the ionization chamber to form at least one of an ion beam or an electron flux, wherein the ion beam or the electron flux comprises no metal.

4. The plasma generator of claim 1, wherein the electron gun includes a thermionic emitter including at least one surface exposed to the primary plasma or the secondary plasma.

5. The plasma generator of claim 4, wherein the thermionic emitter is constructed from a second non-metallic material same as or different from the non-metallic material.

6. The plasma generator of claim 4, wherein the thermionic emitter is constructed from a refractory metal.

7. The plasma generator of claim 1, wherein the secondary plasma in the electron gun is adapted to generate a second plurality of ions supplied from the outlet of the electron gun to the ionization chamber via the aperture.

8. The plasma generator of claim 1, wherein the non-metallic material comprises one of silicon carbide (SiC), silicon nitride ($Si_3N_4$), graphite, diamond, graphene, or vitreous carbon.

9. The plasma generator of claim 1, wherein a voltage of the anode of the at least one electron gun is adjustable by a control circuit to turn off the secondary plasma in the electron gun.

* * * * *